United States Patent
Deguchi et al.

(10) Patent No.: US 8,143,933 B2
(45) Date of Patent: Mar. 27, 2012

(54) SEMICONDUCTOR INTEGRATED CIRCUIT

(75) Inventors: Jun Deguchi, Kanagawa (JP); Daisuke Miyashita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 12/723,822

(22) Filed: Mar. 15, 2010

(65) Prior Publication Data

US 2010/0271106 A1    Oct. 28, 2010

(30) Foreign Application Priority Data

Apr. 24, 2009 (JP) ................................ 2009-106933

(51) Int. Cl.
G06G 7/12 (2006.01)

(52) U.S. Cl. .................. 327/359; 327/355; 455/326

(58) Field of Classification Search .......... 327/355–361; 455/323, 326

See application file for complete search history.

(56) References Cited

U.S. PATENT DOCUMENTS

| | | | | |
|---|---|---|---|---|
| 7,010,387 | B2 * | 3/2006 | Lantry et al. .................. | 700/214 |
| 7,403,048 | B2 * | 7/2008 | Heidari et al. ................ | 327/117 |
| 7,888,978 | B2 * | 2/2011 | Kuroda .......................... | 327/117 |
| 2010/0264979 | A1 | 10/2010 | Deguchi | |

OTHER PUBLICATIONS

Madan, et al. A Direct Conversion 4.9GHz to 5.925GHz OFDM Receiver with Matched Non-Integer Quadrature LO, 2008 IEEE Radio Frequency Integrated Circuits Symposium, pp. 589-592.

Deguchi, et al. A 0.6V 380uW-14dBm LO-Input 2.4GHz Double-Balanced Current-Reusing Single-Gate CMOS Mixer with Cyclic Passive Combiner, 2009 IEEE International Solid-State Circuits Conference, Digest of Technical Papers, Feb. 10, 2009, pp. 224-225.

* cited by examiner

*Primary Examiner* — Dinh T. Le
(74) *Attorney, Agent, or Firm* — Turocy & Watson, LLP

(57) ABSTRACT

A semiconductor integrated circuit includes a mixer circuit unit having a first single gate mixer configured to receive a first input signal having a first frequency and a second input signal having a second frequency as inputs, a second single gate mixer configured to receive the first input signal and a third input signal of a phase inverted from a phase of the second input signal as inputs, a third single gate mixer configured to receive a fourth input signal of a phase inverted from the phase of the first input signal and the second input signal as inputs, and a fourth single gate mixer configured to receive the third and the fourth input signals as inputs; and a ½-frequency divider unit configured to receive output signals from the first to the fourth single gate mixers as inputs and output a desired signal.

14 Claims, 9 Drawing Sheets

SEMICONDUCTOR INTEGRATED CIRCUIT

CROSS REFERENCE TO RELATED APPLICATION

This application is based upon and claims the benefit of priority from the prior Japanese Patent Application No. 2009-106933 filed in Japan on Apr. 24, 2009; the entire contents of which are incorporated herein by reference.

BACKGROUND OF THE INVENTION

1. Field of the Invention

The present invention relates to a semiconductor integrated circuit for use in a local signal generating unit of a communication LSI.

2. Description of the Related Art

Local signals with quadrature phases, which are used in a quadrature modulation type radio transmitter, are generally generated by dividing a frequency of an output signal of a VCO (Voltage Controlled Oscillator) into two with a frequency divider circuit. However, in this method, a second harmonic of a transmission signal, which is transmitted as a local signal, is close to an oscillation frequency of the VCO, a phenomenon called pulling occurs, a component varied in frequency occurs, and a problem of degrading purity of the local signal arises.

Such a problem is described in the prior art document "D. Miyashita, et al., "A low-IF CMOS single-chip Bluetooth EDR transmitter with digital I/Q mismatch trimming circuit," Symposium on VLSI Circuits Digest of Technical Papers, pp. 298-301, 2005.".

This problem can be avoided if the oscillation frequency of the VCO can be made other than integral multiples of the transmission frequency of a local signal. For example, when the transmission frequency as a local signal is 2.4 GHz, the oscillation frequency of the VCO can be set at 6.4 GHz that is 8/3 times as high as 2.4 GHz.

However, if the function of generating signals I and Q in orthogonal relation of 2.4 GHz from a signal of 6.4 GHz is mounted with a general image removing mixer circuit and a ½-frequency divider circuit, the following problem arises. Here, as a ½-frequency divider circuit, for example, a circuit with a configuration as shown in FIG. 3 which will be described later is used. In an ordinary ½-frequency divider circuit, the voltage amplitude of its input signal is required to be as large as possible. Therefore, an amplifier circuit needs to be interposed between output of the image removing mixer circuit and input of the ½-frequency divider circuit. When a signal of 3.2 GHz which is obtained by dividing the frequency of a signal of 6.4 GHz into two, and a signal of 1.6 GHz which is obtained by dividing the frequency of a signal of 3.2 GHz into two are combined in a mixer circuit, an image signal of 1.6 GHz corresponding to a difference is generated due to the influence of IQ imbalance and nonlinearity, other than the desired signal of 4.8 GHz, and the amplifier circuit also simultaneously amplifies the image signal. Further, in an amplifier with radio frequency, which is used as the amplifier circuit, a signal at a lower frequency generally has a higher gain. Accordingly, when the frequency (1.6 GHz) of the image signal is lower than the frequency (2.4 GHz) of the desired signal as in the example described here, the image signal receives a higher gain. Thus, when a desired signal of 2.4 GHz is obtained by dividing the frequency of a signal of 4.8 GHz into two, the voltage amplitude of the image signal of 1.6 GHz which should be removed sometimes becomes larger than the desired signal at the input portion of the ½-frequency divider circuit.

For the purpose of avoiding such a situation, not only an amplifier circuit but also a band-pass filter (hereinafter, called BPF) configured to pass only a desired signal, or a band-removing filter (hereinafter, called BRF) configured to remove an image signal needs to be interposed between the image removing mixer circuit and the ½-frequency divider circuit.

However, the BPF and BRF in the RF frequency band use inductors, and therefore, have a problem of the circuit area becoming very large. Further, depending on the gain of the amplifier circuit relating to the I and Q signals, a problem of increasing the possibility of the circuit oscillating in a common mode arises.

BRIEF SUMMARY OF THE INVENTION

A semiconductor integrated circuit of one aspect of the present invention has a mixer circuit unit configured to receive a first voltage signal having a first frequency, a second voltage signal of a phase inverted from a phase of the first voltage signal, a third voltage signal of a phase orthogonalized to the phase of the first voltage signal, and a fourth voltage signal of a phase inverted from the phase of the third voltage signal, and receive a fifth voltage signal having a second frequency, a sixth voltage signal of a phase inverted from a phase of the fifth voltage signal, a seventh voltage signal of a phase orthogonalized to the phase of the fifth voltage signal, and an eighth voltage signal of a phase inverted from the phase of the seventh voltage signal, and add or subtract the first frequency and the second frequency to make a plurality of current signals to output the plurality of current signals from a predetermined output channel, and a ½-frequency divider unit configured to carry out ½-frequency division by using the plurality of current signals, and output a first to a fourth output signal of four phases obtained by dividing into two a signal which is obtained by frequency-addition or subtraction of the first frequency and the second frequency in the mixer circuit unit, with phases orthogonalized to each other, and by inverting the two signals with the orthogonalized phases, and a bias current flows on the predetermined output channel.

A semiconductor integrated circuit of another aspect of the present invention has a mixer circuit unit configured to receive a first voltage signal having a first frequency and a second voltage signal of a phase inverted from a phase of the first voltage signal, and receive a third voltage signal having a second frequency and a fourth voltage signal of a phase inverted from the phase of the third voltage signal, and add or subtract the first frequency and the second frequency to make a plurality of current signals to output the plurality of current signals from a predetermined output channel, a ½-frequency divider unit configured to carry out ½-frequency division by using the plurality of current signals, and a frequency selective circuit unit provided at an output channel of the ½-frequency divider unit and configured to output only a signal with a predetermined frequency selectively, and a bias current flows on the predetermined output channel.

A semiconductor integrated circuit of another aspect of the present invention includes a mixer circuit unit having a first single gate mixer configured to receive a first input signal having a first frequency and a second input signal having a second frequency as inputs, a second single gate mixer configured to receive the first input signal and a third input signal of a phase inverted from a phase of the second input signal as inputs, a third single gate mixer configured to receive a fourth input signal of a phase inverted from the phase of the first input signal and the second input signal as inputs, and a fourth single gate mixer configured to receive the third and the fourth input signals as inputs; and a ½-frequency divider unit configured to receive output signals from the first to the fourth single gate mixers as inputs and output a desired signal.

DETAILED DESCRIPTION OF THE INVENTION

Hereinafter, embodiments of the present invention will be described in detail with reference to the drawings.

A prior art related to the present invention will be described with reference to FIG. 10 before the embodiments of the present invention are described with FIGS. 1 to 9.

Local signals of quadrature phases which are used in a radio transmitter of a quadrature modulation method are ordinarily generated by dividing the frequency of an output signal of a VCO into two with a frequency divider circuit. However, a second harmonic of a transmission signal which is transmitted as a local signal becomes close to an oscillation frequency of the VCO, a phenomenon called pulling occurs, and a problem of deterioration of the purity of the local signals arises. It is known that the problem can be avoided if the oscillation frequency of the VCO can be made the multiples other than integral multiples of the transmission frequency. For example, when the transmission frequency is 2.4 GHz, the oscillation frequency of the VCO can be made 6.4 GHz, which is 8/3 times as high as 2.4 GHz. A component of the same phase component (hereinafter, an I signal) of 2.4 GHz and a quadrature component (hereinafter, a Q signal) of 2.4 GHz can be made from a signal of 6.4 GHz as shown in FIG. 10.

Figure 10:
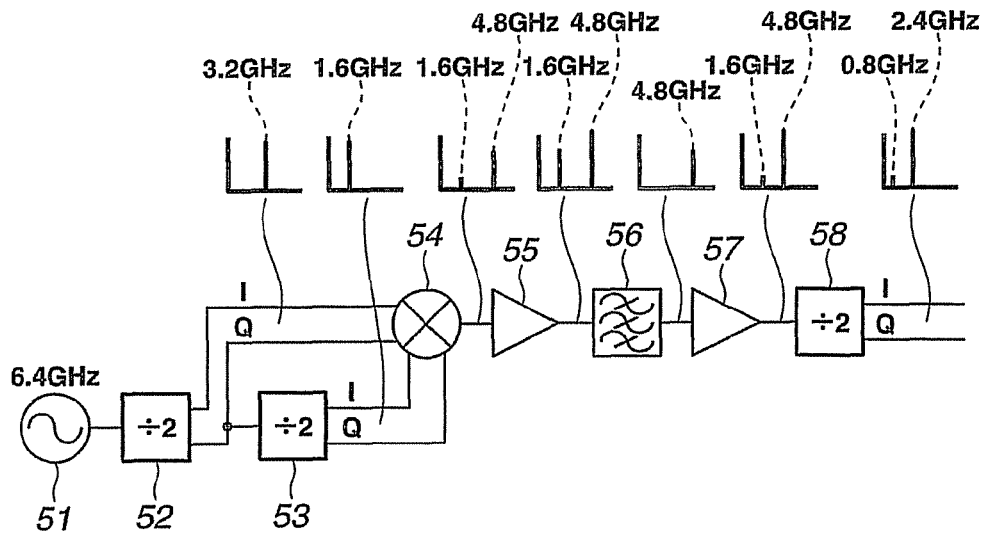
FIG. 10 is a block diagram showing a configuration of a semiconductor integrated circuit of a conventional example.

FIG. 10 shows a configuration of the semiconductor integrated circuit used in a local signal generating unit of a prior art.

First, I and Q signals of 3.2 GHz, which are obtained by dividing the frequency of a signal of 6.4 GHz generated in a VCO 51 into two with a ½-frequency divider circuit 52, and I and Q signals of 1.6 GHz, which are obtained by further dividing the frequency of the signal into two with a ½-frequency divider circuit 53, are generated, and these signals are combined by an image removing mixer circuit 54 to make a signal of 4.8 GHz. If the frequency of the signal of 4.8 GHz is divided into two with a ½-frequency divider circuit 58, I and Q signals of 2.4 GHz are obtained.

However, if this function is mounted with only the ordinary image removing mixer circuit 54 and the ½-frequency divider circuit 58, the problem as follows arises. In order that an ordinary ½-frequency divider circuit is normally operated, a voltage amplitude of an input signal which is supplied to the ½-frequency divider circuit ordinarily needs to be as large as possible. Accordingly, at least an amplifier circuit 55 with a radio frequency needs to be interposed between an output end of the image removing mixer circuit 54 and an input end of the ½-frequency divider circuit 58. Further, when the signal of 3.2 GHz and the signal of 1.6 GHz are combined by the image removing mixer circuit 54, an image signal of 1.6 GHz which is a subtraction component occurs due to the influence of the IQ imbalance and nonlinearity, in addition to the desired signal of 4.8 GHz which is an addition component, and the amplifier circuit 55 simultaneously amplifies the image signal. Further, in a case where the frequency (1.6 GHz) of the image signal is lower than the frequency (2.4 GHz) of the desired signal as in this example, a gain received by the image signal becomes high due to the gain characteristic of the amplifier circuit 55 with a radio frequency (the characteristic that the gain becomes high at a low frequency part), and the voltage amplitude of the image signal (1.6 GHz) sometimes becomes larger than the desired signal (2.4 GHz) at an input portion of the ½-frequency divider circuit 58. In order to avoid such a situation, not only the amplifier circuit 55, but also a BPF (or a BRF which removes the image signal) 56 which passes only the desired signal needs to be interposed between the image removing mixer circuit 54 and the ½-frequency divider circuit 58. Thus, when the BPF (or the BRF) 56 is disposed to allow a signal to pass through, the voltage amplitude of the signal lowers, and therefore, at least one more stage of the amplifier circuit 57 is to be disposed to amplify the signal, and inputs the signal to the ½-frequency divider circuit 58.

However, if such a configuration is adopted, the amplifier circuit, and the BPF or the BRF are added, and in addition, a problem of the circuit area becoming very large arises since the BPF or BRF in an RF frequency band uses an inductor. Further, depending on the gain of the amplifier circuit, there arises a problem of increasing the possibility of the circuit being oscillated in a common mode.

Figure 11:
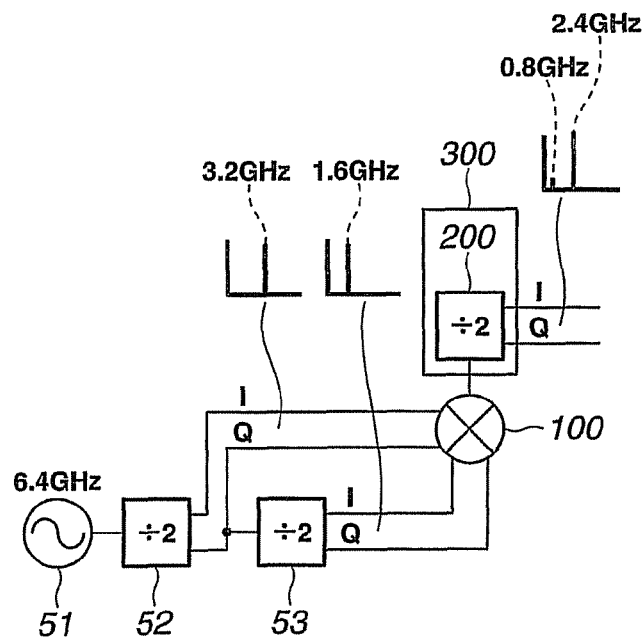
FIG. 11 is a block diagram showing a configuration of the semiconductor integrated circuit according to the present invention.

Thus, in the following embodiments according to the present invention, the amplifier circuits 55 and 57, and the BPF (or the BRF) 56 in FIG. 10 are omitted as shown in FIG. 11, the image removing mixer circuit 54 and the ½-frequency divider circuit 58 (shown as an image removing mixer circuit unit (hereinafter, simply called a mixer circuit unit) 100 and a ½-frequency divider unit 200 in FIG. 11) are functionally integrated, and a semiconductor integrated circuit 300 including an image removing mixer function (a frequency converting function and an image removing function) and an amplifying function, and a ½-frequency dividing function is configured, whereby these problems are solved.

First Embodiment

Figure 1:
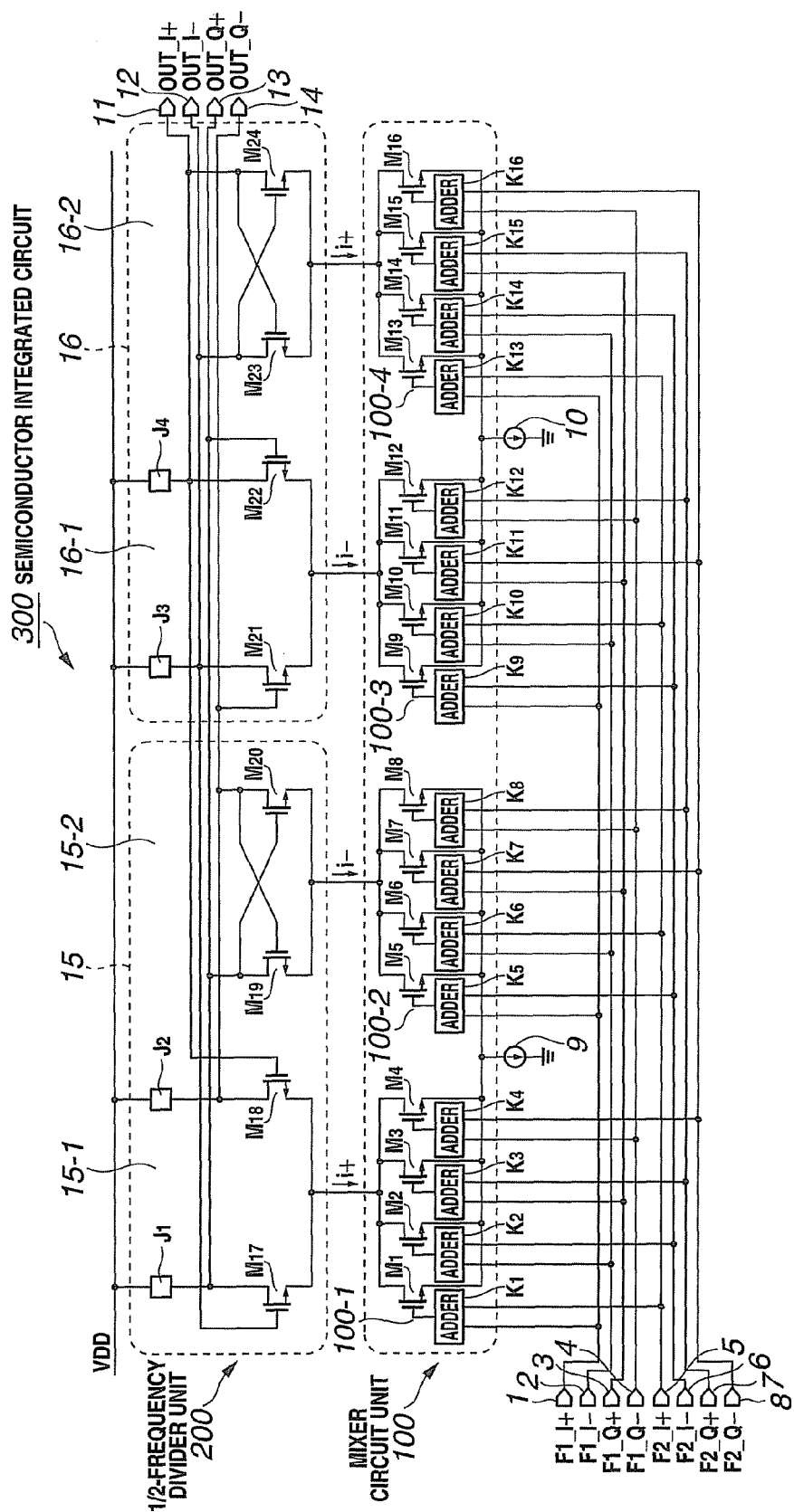
FIG. 1 is a circuit diagram showing a schematic configuration of a semiconductor integrated circuit of a first embodiment of the present invention.
Figure 2:
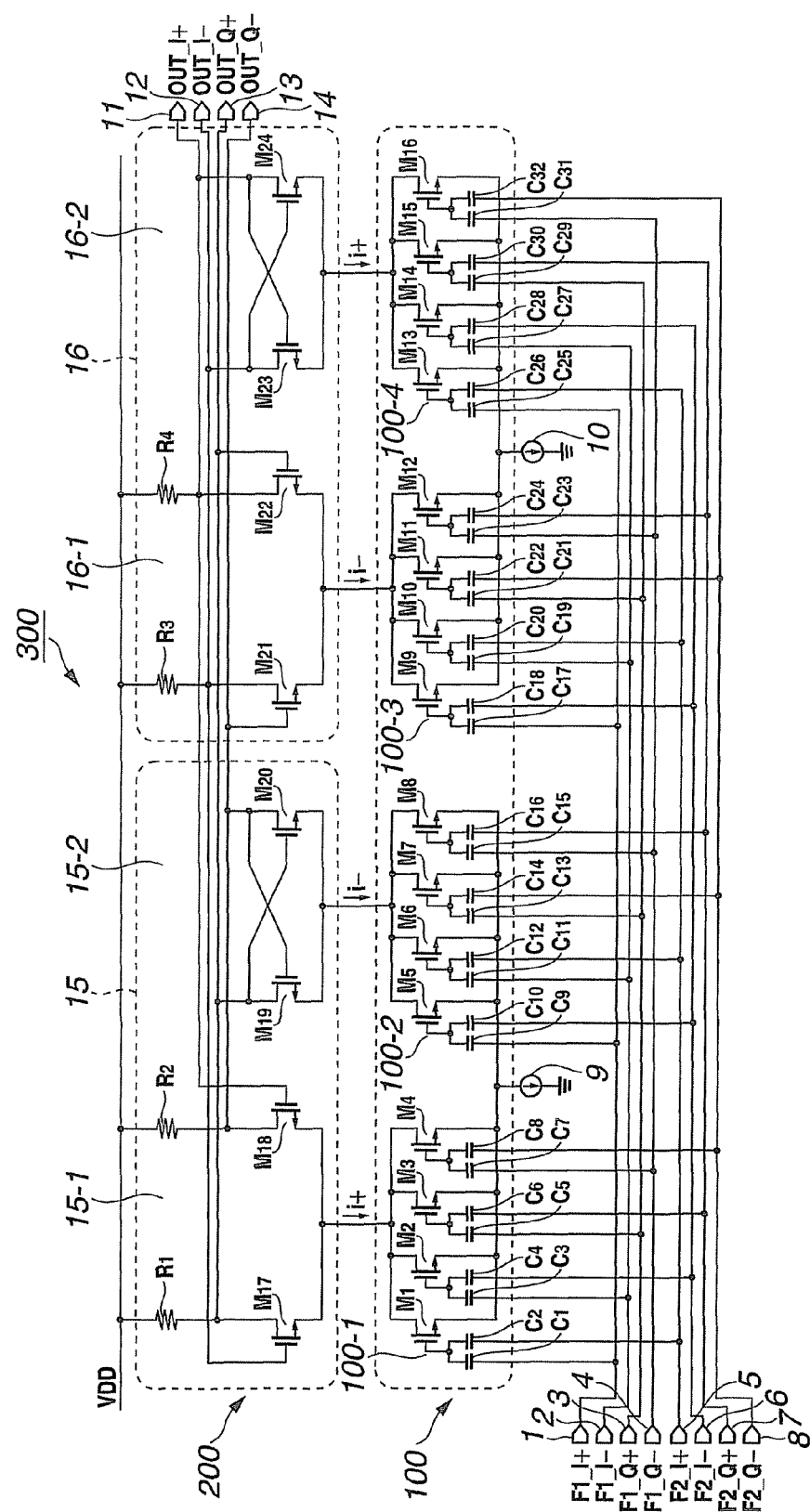
FIG. 2 is a circuit diagram showing the semiconductor integrated circuit of the first embodiment of the present invention.
Figure 3:
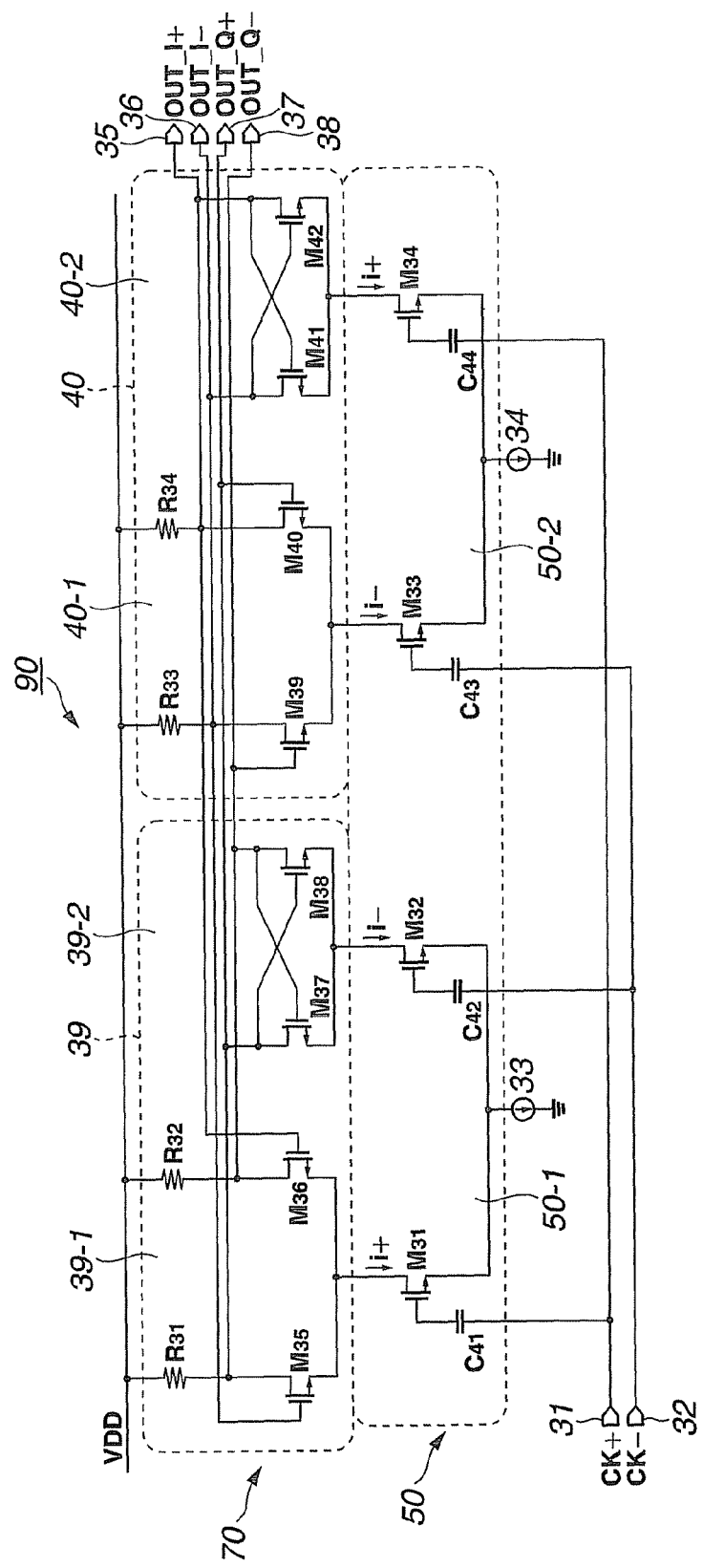
FIG. 3 is a circuit diagram showing an ordinary ½-frequency divider circuit.

FIG. 1 shows a schematic configuration of a semiconductor integrated circuit of a first embodiment of the present invention. FIG. 2 shows a configuration in which FIG. 1 is further embodied. FIG. 3 shows a configuration of an ordinary ½-frequency divider circuit. In each of the circuits in FIGS. 1 to 3, a DC bias of a transistor of a clock input unit (100 or 50) is omitted. In the embodiment of the present invention except for FIG. 3, the clock input unit 100 configures a mixer circuit unit including an image removing mixer function (frequency converting function and an image removing function) and an amplifying function, and therefore, the description will be made hereinafter with the clock input unit 100 described as the mixer circuit unit 100. However, the clock input unit 50 is a clock input unit in an ordinary ½-frequency divider circuit (FIG. 3), and therefore, reference numeral 50 is left as it is.

First, with use of FIG. 3, a circuit configuration of an ordinary ½-frequency divider circuit will be described. A ½-frequency divider circuit 90 shown in FIG. 3 may be considered the same as the ½-frequency divider circuit 58 in FIG. 10.

The ½-frequency divider circuit 90 shown in FIG. 3 includes a first input terminal 31, a second input terminal 32, the clock input unit 50, a ½-frequency divider unit 70, constant current sources 33 and 34, and output terminals 35, 36, 37 and 38.

A first voltage signal CK+ with a frequency F is inputted to the first input terminal 31.

A second voltage signal CK− of a phase inverted from a phase of the first voltage signal with the frequency F is inputted to the second input terminal 32.

The clock input unit 50 includes a first and a second voltage-current conversion units 50-1 and 50-2, and converts an inputted voltage signal into a current signal.

The ½-frequency divider unit 70 includes a first and a second latch units 39 and 40, and has a function of performing a ½-frequency dividing operation.

More specifically, the ½-frequency divider circuit 90 uses timings of the first and the second voltage signals CK+ and CK−, and generates an I signal and a Q signal of phases orthogonalized to each other at the timing of ½ of a CK frequency. The ½-frequency divider circuit 90 includes the first voltage-current conversion unit 50-1 having MOS FET transistors (hereinafter, simply called MOS transistors) M31 and M32 which form a differential pair, a second voltage-current conversion unit 50-2 having MOS transistors M33 and M34 which form a differential pair, a first latch unit 39 which operates as a Q signal generating unit having MOS transistors M35 to M38 which form two differential pairs, and a second latch unit 40 which operates as an I signal generating unit having MOS transistors M39 to M42 which form two differential pairs.

The first voltage-current conversion unit 50-1 includes the first and the second MOS transistors M31 and M32 which form a differential pair, and a first and a second inputting capacitors C41 and C42 as a first and a second impedance elements provided at respective gates of these MOS transistors M31 and M32.

The second voltage-current conversion unit 50-2 includes the third and the fourth MOS transistors M33 and M34 which faun a differential pair, and a third and a fourth input capacitors C43 and C44 which are provided at respective gates of these MOS transistors M33 and M34.

Source common connecting points of the MOS transistors M31 and M32 of the first voltage-current conversion unit 50-1 are connected to a stable potential point (a reference potential point such as a ground GND) via a first constant current source 33. Further, a source common connecting point of the MOS transistors M33 and M34 of the second voltage-current conversion unit 50-2 is connected to a stable potential point via a second constant current source 34.

The first and the second constant current sources 33 and 34 may be omitted, and the source common connecting points may be directly connected to the stable potential point (the reference potential point such as the ground GND). More specifically, currents i+ and i− which respectively flow in the MOS transistors (M31, M34) and the MOS transistors (M32, M33) can be passed to the stable potential point.

The first latch unit 39 includes the fifth and the sixth MOS transistors M35 and M36 which form a differential pair, and load resistances R31 and R32 for output which are connected to between respective drains of the MOS transistors M35 and M36 and a power supply line of a predetermined positive potential VDD, and the seventh and the eighth MOS transistors M37 and M38 which are cross-connected to each other between gates and drains.

The second latch unit 40 includes the ninth and the tenth MOS transistors M39 and M40 which form a differential pair, load resistances R33 and R34 which are connected to between respective drains of the MOS transistors M39 and M40 and the power supply line of the positive predetermined potential VDD, and the eleventh and the twelfth MOS transistors M41 and M42 which are cross-connected to each other between gates and drains.

Both the first and the second latch units 39 and 40 have the latch functions of holding or changing the I signal and the Q signal at the timing of the frequency of ½ of a CK frequency.

Further, the voltage signal CK− which is inputted from the input terminal 32 is an inversion signal of the voltage signal CK+ which is inputted from the input terminal 31. The first voltage-current conversion unit 50-1 and the second voltage-current conversion unit 50-2 convert the voltage signals CK+ and CK− of the phases inverted from each other, which are inputted respectively from the input terminals 31 and 32, into four current signals of two kinds. The MOS transistors M31 and M34 are driven by the same voltage signal CK+, and therefore, two output currents thereof are the same current i+. The MOS transistors M32 and M33 are driven by the same voltage signal CK−, and therefore, two output currents thereof are the same current i−.

The MOS transistors M31 and M34 the gates of which are connected to the input terminal 31 via the capacitors C41 and C44 repeat being switched on and off in response to the CK signal. Here, the duty ratio of the CK signal with the frequency F is set as, for example, 50%.

When the inversed signal CK− of the CK signal CK+ of the input terminal 31 is inputted to the input terminal 32, the transistors M32 and M33, the gates of which are connected to the input terminal 32 via the capacitors C42 and C43, repeat being switched on and off at the timings in the inversed relation (the relation in which the phases differ by about 180 degrees) with the on and off of the MOS transistors M31 and M34.

Further, the first latch unit 39 as the Q signal generating unit, and the second latch unit 40 as the I signal generating unit use the timings of the voltage signals CK+ and CK− to generate the Q signals and the I signals which are frequency-divided signals having frequencies of ½ of the frequencies of the voltage signals, and having the phases orthogonalized to each other. As a result, the ½-frequency divider unit 70 outputs I signals OUT_I+ and OUT_I− of the phases of 0 degrees and 180 degrees from output terminals 35 and 36, and outputs the Q signals OUT_Q+ and OUT_Q− of the phases of 90 degrees and 270 degrees from output terminals 37 and 38. When the CK signals are not inputted, the previous state (on, off) is kept by the cross-connected latch core unit (the transistors M37 and M38, or the transistors M41 and M42).

Next, a schematic configuration of the first embodiment of the present invention will be described with reference to FIG. 1.

In FIG. 1, the semiconductor integrated circuit 300 includes a first input terminal 1 configured to receive a first voltage signal having a first frequency F1, a second input terminal 2 configured to receive a second voltage signal of a phase inverted from a phase of the first voltage signal, a third input terminal 3 configured to receive a third voltage signal of a phase orthogonalized to the phase of the first voltage signal, a fourth input terminal 4 configured to receive a fourth voltage signal of a phase inverted from the phase of the third voltage signal, a fifth input terminal 5 configured to receive a fifth voltage signal having a second frequency F2 differing from the first frequency, a sixth input terminal 6 configured to receive a sixth voltage signal of a phase inverted from the phase of the fifth voltage signal, a seventh input terminal 7 configured to receive a seventh voltage signal of a phase orthogonalized to the phase of the fifth voltage signal, and an eighth input terminal 8 configured to receive an eighth voltage signal of a phase inverted from the phase of the seventh voltage signal.

Further, the semiconductor integrated circuit 300 includes a first transistor M1 in which the first voltage signal and the fifth voltage signal are inputted to a gate by being added or subtracted via an adder K1, a second transistor M2 in which the second voltage signal and the sixth voltage signal are inputted to a gate by being added or subtracted via an adder K2, a third transistor M3 in which the third voltage signal and the seventh voltage signal are inputted to a gate by being added or subtracted via an adder K3, a fourth transistor M4 in which the fourth voltage signal and the eighth voltage signal are inputted to a gate by being added or subtracted via an adder K4, a fifth transistor M5 in which the first voltage signal and the sixth voltage signal are inputted to a gate by being added or subtracted via an adder K5, a sixth transistor M6 in which the second voltage signal and the fifth voltage signal are inputted to a gate by being added or subtracted via an adder K6, a seventh transistor M7 in which the third voltage signal and the eighth voltage signal are inputted to a gate by being added or subtracted via an adder K7, an eighth transistor M8 in which the fourth voltage signal and the seventh voltage signal are inputted to a gate by being added or subtracted via an adder K8, a ninth transistor M9 in which the first voltage signal and the sixth voltage signal are inputted to a gate by being added or subtracted via an adder K9, a tenth transistor M10 in which the second voltage signal and the fifth voltage signal are inputted to a gate by being added or subtracted via an adder K10, an eleventh transistor M11 in which the third voltage signal and the eighth voltage signal are inputted to a gate by being added or subtracted via an adder K11, a twelfth transistor M12 in which the fourth voltage signal and the seventh voltage signal are inputted to a gate by being added or subtracted via an adder K12, a thirteenth transistor M13 in which the first voltage signal and the fifth voltage signal are inputted to a gate by being added or subtracted via an adder K13, a fourteenth transistor M14 in which the second voltage signal and the sixth voltage signal are inputted to a gate by being added or subtracted via an adder K14, a fifteenth transistor M15 in which the third voltage signal and the seventh voltage signal are inputted to a gate by being added or subtracted via an adder K15, and a sixteenth transistor M16 in which the fourth voltage signal and the eighth voltage signal are inputted to a gate by being added or subtracted via an adder K16.

Further, the semiconductor integrated circuit 300 includes a first constant current source 9 or a stable potential point to which a point commonly connecting sources of the first to the eighth transistors M1 to M8 is connected, and a second constant current source 10 or a stable potential point to which a point commonly connecting sources of the ninth to the sixteenth transistors M9 to M16 is connected.

Further, the semiconductor integrated circuit 300 includes a seventeenth and an eighteenth transistors M17 and M18 which form a differential pair, with a point commonly connecting respective sources being connected to a drain common connecting point of the first to the fourth transistors, a first load circuit J1 which is connected to between a drain of the seventeenth transistor M17 and a power supply line, a second load circuit J2 which is connected to between a drain of the eighteenth transistor M18 and the power supply line, a nineteenth and a twentieth transistors M19 and M20 which form a differential pair, have respective drains connected to the respective drains of the seventeenth and the eighteenth transistors M17 and M18, have respective sources connected to a drain common connecting point of the fifth to the eighth transistors, and have a latch function with the respective gates and the respective drains being cross-connected to one another, a twenty-first and a twenty-second transistors M21 and M22 which form a differential pair, have a point commonly connecting respective sources connected to a drain common connecting point of the ninth to the twelfth transistors, and have respective gates connected to the drains of the eighteenth and the seventeenth transistors M18 and M17, a third load circuit J3 which is connected to between a drain of the twenty-first transistor M21 and the power supply line, a fourth load circuit J4 which is connected to between a drain of the twenty-second transistor M22 and the power supply line, and a twenty-third and a twenty-fourth transistors M23 and M24 which form a differential pair, have respective drains connected to the respective drains of the twenty-first and the twenty-second transistors M21 and M22, have a point commonly connecting respective sources connected to a drain common connecting point of the thirteenth to the sixteenth transistors, have the respective drains connected to respective gates of the seventeenth and the eighteenth transistors M17 and M18, and have a latch function with respective gates and the respective drains being cross-connected to one another. Each of the load circuits J1 to J4 includes a load resistance, an inductor, or a transistor load.

Further, the semiconductor integrated circuit 300 includes a first output terminal 11 which is connected to the drains of the twenty-second and the twenty-fourth transistors M22 and M24, and outputs a first output signal obtained with a frequency obtained by dividing the frequency that is the first frequency and the second frequency being added or subtracted into two, a second output terminal 12 which is connected to the drains of the twenty-first and the twenty-third transistors M21 and M23, and outputs a second output signal of a phase inverted from a phase of the first output signal, a third output terminal 13 which is connected to the drains of the seventeenth and the nineteenth transistors M17 and M19, and outputs a third output signal of a phase orthogonalized to the phase of the first output signal, and a fourth output terminal 14 which is connected to the drains of the eighteenth and the twentieth transistors M18 and M20, and outputs a fourth output signal of a phase inverted from the phase of the third output signal.

The semiconductor integrated circuit of the first embodiment configures the clock input unit 50 which generates input to be supplied to the ½-frequency divider unit 70 of the ordinary ½-frequency divider circuit shown in FIG. 3 as the mixer circuit unit 100 using a single gate mixer, instead of a simple voltage-current conversion unit, and thereby, realizes the function with the image removing mixer circuit, the frequency divider circuit and the amplifying function being integrated, by one circuit. The circuit has the characteristics that the amplifier circuit and the BPF/BRF do not have to be especially prepared, and that the image removing mixer circuit unit 100 and the ½-frequency divider unit 200 share a bias current (DC current), and realizes the configuration in which the circuit area and the power consumption are reduced. The circuit is such that when signals with two different frequencies F1 and F2 are inputted, the frequency of (F1+F2)/2 or (F1−F2)/2 is obtained as an output.

For the input signals, signals F1_I+, F1_I−, F1_Q+, F1_Q−, F2_I+, F2_I−, F2_Q+, and F2_Q of four phases of I+, I−, Q+ and Q− which are each shifted by 90 degrees with respect to the frequencies F1 and F2 are used. The signals of the four phases can be created by using a frequency divider circuit and a phase shifter circuit not illustrated. As a result of multiplication in the mixer circuit unit 100, for example, the frequencies are added, and a sine wave with the frequencies F1+F2 is obtained, and is supplied to the ½-frequency divider unit 200. The output signals from the ½-frequency divider unit 200 have the frequencies divided into two, and become signals OUT_I+, OUT_I−, OUT_Q+ and OUT_Q− of four phases with a frequency of (F1+F2)/2.

More concrete description will be made with reference to FIG. 2.

The semiconductor integrated circuit 300 includes the input terminals 1, 2, 3, 4, 5, 6, 7 and 8, the mixer circuit unit 100 having the image removing mixer function (the frequency converting function and the image removing function) and the amplifying function, the ½-frequency divider unit 200 and the output terminals 11, 12, 13 and 14.

Signals with the two frequencies F1 and F2 which differ from each other are inputted to the group of the input terminals 1, 2, 3 and 4 and the group of the input terminals 5, 6, 7 and 8.

The I and Q signals with the frequency F1 of phases orthogonalized to each other are inputted to the group of the input terminals 1 and 2 and the group of the input terminals 3 and 4 in the input terminals 1, 2, 3 and 4. An I signal F1_I+ with the frequency F1 and a signal F1_I− of a phase inverted from the phase of the I signal F1_I+ are inputted to the input terminals 1 and 2, respectively. A Q signal F1_Q+ with the frequency F1 and a signal F1_Q− of a phase inverted from a phase of the Q signal F1_Q+ are inputted to the input terminals 3 and 4, respectively.

The I and Q signals with frequencies F2 of the phases orthogonalized to each other are inputted to a group of the input terminals 5 and 6, and a group of the input terminals 7 and 8 in the input terminals 5, 6, 7 and 8. An I signal F2_I+ with the frequency F2 and a signal F2_I− of a phase inverted from a phase of the I signal F2_I+ are inputted respectively to the input terminals 5 and 6. A Q signal F2_Q+ with the frequency F2, and a signal F2_Q− of a phase inverted from the Q signal F2_Q+ are inputted respectively to the input terminals 7 and 8.

The mixer circuit unit 100 has the frequency converting function and image removing function, and amplifying function, including a plurality of single gate mixers by a plurality of single gate MOS transistors.

The mixer circuit unit 100 includes, for example, 16 single gate mixers, and is provided with four groups of single gate mixers, with each group made by four single gate mixers being connected in parallel, out of 16 single gate mixers. Hereinafter, the mixer circuit unit 100 will be described as the circuit unit in which four groups of a first to a fourth mixer units 100_1 to 100_4 are arranged in sequence from the left side of FIG. 1. Each of the single gate mixers includes two capacitors which are two impedance elements configuring an adder configured to simultaneously receive two signals with different frequencies to, for example, add them and one MOS transistor which is a single gate transistor configured to have the added signal inputted to a gate and mix it (mixing).

The two capacitors, which are two impedance elements, have their respective output points commonly connected, and the common connecting point is connected to a gate of one MOS transistor gate.

The first mixer unit 100-1 has a first single gate mixer including capacitors C1 and C2 and a MOS transistor M1, a second single gate mixer including capacitors C3 and C4 and a MOS transistor M2, a third single gate mixer including capacitors C5 and C6 and a MOS transistor M3, and a fourth single gate mixer including capacitors C7 and C8 and a MOS transistor M4.

Respective gates of the MOS transistors M1 to M4 are connected to common connecting points of output ends of respective groups of the two capacitors C1 and C2, the two capacitors C3 and C4, the two capacitors C5 and C6, and the two capacitors C7 and C8. Respective drains of the MOS transistors M1 to M4 are commonly connected, and the drain common connecting point is connected to a source common connecting point of MOS transistors M17 and M18 of the ½-frequency divider unit 200 at the upper stage shown in the drawing. Respective sources of the MOS transistors M1 to M4 are commonly connected, and the source common connecting point is connected to the reference potential point as a stable potential point through the constant current source 9.

The capacitors C1 and C2 respectively receive two signals F1_I+ and F2_I+ of the same phase component (I signal) with the frequencies F1 and F2 which differ from each other, and capacitively couple (add) the signals. The MOS transistor M1 has the added two signals F1_I+ and F2_I+ inputted to the gate, and mixes (mixing) and amplifies the signals.

The capacitors C3 and C4 respectively receive the two signals F1_I− and F2_I− of the phases inversed from the same phase component (I signal) with the frequencies F1 and F2 which differ from each other, and capacitively couple (add) the signals. The MOS transistor M2 has the added two signals F1_I− and F2_I− inputted to the gate, mixes (mixing) and amplifies the signals.

The capacitors C5 and C6 respectively receive two signals F1_Q+ and F2_Q+ of the quadrature component (Q signal) with the frequencies F1 and F2 which differ from each other, and capacitively couple (add) the signals. The MOS transistor M3 has the added two signals F1_Q+ and F2_Q+ inputted to the gate, and mixes (mixing) and amplifies the signals.

The capacitors C7 and C8 respectively receive two signals F1_Q− and F2_Q− of the component inversed from the quadrature component (Q signal) with the frequencies F1 and F2 which differ from each other, and capacitively couple (add) the signals. The MOS transistor M4 has the added two signals F1_Q− and F2_Q− inputted to the gate, and mixes (mixing) and amplifies the signals.

The second mixer unit 100-2 has a fifth single gate mixer including capacitors C9 and C10 and a MOS transistor M5, a sixth single gate mixer including capacitors C11 and C12 and a MOS transistor M6, a seventh single gate mixer including capacitors C13 and C14 and a MOS transistor M7, and an eighth single gate mixer including capacitors C15 and C16 and a MOS transistor M8.

Respective gates of the MOS transistors M5 to M8 are connected to common connecting points of output ends of respective groups of the two capacitors C9 and C10, the two capacitors C11 and C12, the two capacitors C13 and C14, and the two capacitors C15 and C16. Respective drains of the MOS transistors M5 to M8 are commonly connected, and the drain common connecting point is connected to a source common connecting point of MOS transistors M19 and M20 of the ½-frequency divider unit 200 at the upper stage. Respective sources of the MOS transistors M5 to M8 are commonly connected, and the source common connecting point is connected to the reference potential point as a stable potential point through the constant current source 9.

The capacitors C9 and C10 respectively receive the two signals F1_I+ and F2_I− of the phase of the same phase component (I signal) and the phase inverted from the same phase component with the frequencies F1 and F2 which differ from each other, and capacitively couple (add) the signals. The MOS transistor M5 has the added two signals F1_I+ and F2_I− inputted to the gate, and mixes (mixing) and amplifies the signals.

The capacitors C11 and C12 respectively receive the two signals F1_I− and F2_I+ of a phase inverted from the same phase component (I signal) and a phase of the same phase component with the frequencies F1 and F2 which differ from each other, and capacitively couple (add) the signals. The MOS transistor M6 has the added two signals F1_I− and F2_I+ inputted to the gate, and mixes (mixing) and amplifies the signals.

The capacitors C13 and C14 respectively receive the two signals F1_Q+ and F2_Q− of a phase of the quadrature component (Q signal) and a phase inverted from the quadrature component with the frequencies F1 and F2 which differ from each other, and capacitively couple (add) the signals. The MOS transistor M7 has the added two signals F1_Q+ and F2_Q− inputted to the gate, and mixes (mixing) and amplifies the signals.

The capacitors C15 and C16 respectively receive two signals F1_Q− and F2_Q+ of the phase inverted from the quadrature component (Q signal) and the phase of the quadrature component with the frequencies F1 and F2 which differ from each other, and capacitively couple (add) the signals. The MOS transistor M8 has the added two signals F1_Q− and F2_Q+ inputted to the gate, and mixes (mixing) and amplifies the signals.

The third mixer unit 100-3 has a ninth single gate mixer including capacitors C17 and C18, and a MOS transistor M9, a tenth single gate mixer including capacitors C19 and C20, and a MOS transistor M10, an eleventh single gate mixer including capacitors C21 and C22, and a MOS transistor M11, and a twelfth single gate mixer including capacitors C23 and C24, and a MOS transistor M12.

Respective gates of the MOS transistors M9 to M12 are connected to common connecting points of output ends of respective groups of the two capacitors C17 and C18, the two capacitors C19 and C20, the two capacitors C21 and C22, and the two capacitors C23 and C24. Respective drains of the MOS transistors M9 to M12 are commonly connected, and the drain common connecting point is connected to a source common connecting point of MOS transistors M21 and M22 of the ½-frequency divider unit 200 at the upper stage. Respective sources of the MOS transistors M9 to M12 are commonly connected, and the source common connecting point is connected to the reference potential point as a stable potential point through a constant current source 10.

The capacitors C17 and C18 respectively receive the two signals F1_I+ and F2_I− of a phase of the same phase component (I signal) and a phase inverted from the same phase component with the frequencies F1 and F2 which differ from each other, and capacitively couple (add) the signals. The MOS transistor M9 has the added two signals F1_I+ and F2_I− inputted to the gate, and mixes (mixing) and amplifies the signals.

The capacitors C19 and C20 respectively receive the two signals F1_I− and F2_I+ of a phase inverted from the same phase component (I signal) and a phase of the same phase component with the frequencies F1 and F2 which differ from each other, and capacitively couple (add) the signals. The MOS transistor M10 has the added two signals F1_I− and F2_I+ inputted to the gate, and mixes (mixing) and amplifies the signals.

The capacitors C21 and C22 respectively receive the two signals F1_Q+ and F2_Q− of a phase of the quadrature component (Q signal) and a phase inverted from the quadrature component with the frequencies F1 and F2 which differ from each other, and capacitively couple (add) the signals. The MOS transistor M11 has the added two signals F1_Q+ and F2_Q− inputted to the gate, and mixes (mixing) and amplifies the signals.

The capacitors C23 and C24 respectively receive two signals F1_Q− and F2_Q+ of the phase inverted from the quadrature component (Q signal) and the phase of the quadrature component with the frequencies F1 and F2 which differ from each other, and capacitively couple (add) the component. The MOS transistor M12 has the added two signals F1_Q− and F2_Q+ inputted to the gate, and mixes (mixing) and amplifies the signals.

The fourth mixer unit 100-4 has a thirteenth single gate mixer including capacitors C25 and C26 and a MOS transistor M13, a fourteenth single gate mixer including capacitors C27 and C28 and a MOS transistor M14, a fifteenth single gate mixer including capacitors C29 and C30 and a MOS transistor M15, and a sixteenth single gate mixer including capacitors C31 and C32 and a MOS transistor M16.

Respective gates of the MOS transistors M13 to M16 are connected to common connecting points of the respective two capacitors C25 and C26, two capacitors C27 and C28, two capacitors C29 and C30, and two capacitors C31 and C32. Respective drains of the MOS transistors M13 to M16 are commonly connected, and the drain common connecting point is connected to a source common connecting point of MOS transistors M23 and M24 of the ½-frequency divider unit 200 at the upper stage. Respective sources of the MOS transistors M13 to M16 are commonly connected, and the source common connecting point is connected to the reference potential point as a stable potential point through the constant current source 10.

The capacitors C25 and C26 respectively receive two signals F1_I+ and F2_I+ of the same phase component (I signal) with the frequencies F1 and F2 which differ from each other, and capacitively couple (add) the signals. The MOS transistor M13 has the added two signals F1_I+ and F2_I+ inputted to the gate, and mixes (mixing) and amplifies the signals.

The capacitors C27 and C28 respectively receive the two signals F1_I− and F2_I− of the phase inverted from the same phase component (I signal) with the frequencies F1 and F2 which differ from each other, and capacitively couple (add) the signals. The MOS transistor M14 has the added two signals F1_I− and F2_I− inputted to the gate, mixes (mixing) and amplifies the signals.

The capacitors C29 and C30 respectively receive two signals F1_Q+ and F2_Q+ of the quadrature component (Q signal) with the frequencies F1 and F2 which differ from each other, and capacitively couple (add) the signals. The MOS transistor M15 has the added two signals F1_Q+ and F2_Q+ inputted to the gate, and mixes (mixing) and amplifies the signals.

The capacitors C31 and C32 respectively receive two signals F1_Q– and F2_Q– of a phase inverted from the quadrature component (Q signal) with the frequencies F1 and F2 which differ from each other, and capacitively couple (add) the signals. The MOS transistor M16 has the added two signals F1_Q– and F2_Q– inputted to the gate, and mixes (mixing) and amplifies the signals.

The ½-frequency divider unit 200 includes a first and a second latch units 15 and 16, and has the function of performing a ½-frequency dividing operation. The configuration of the ½-frequency divider unit 200 is the same as that of the ½-frequency divider unit 70 of FIG. 3.

The first latch unit 15 as a Q signal generating unit includes the MOS transistors M17 and M18 forming a differential pair, load resistances R1 and R2 for output, and the MOS transistors M19 and M20 which are cross-connected to each other between gates and drains.

In the first latch unit 15, respective sources of the MOS transistors M17 and M18 are commonly connected, and the source common connecting point is connected to the drain common connecting point of the MOS transistors M1 to M4 of the aforementioned mixer circuit unit 100 at the lower stage shown in the drawing. Respective drains of the MOS transistors M17 and M18 are connected to a power supply line of a positive voltage VDD respectively via the load resistances R1 and 2. Respective gates of the MOS transistors M17 and M18 are connected to respective drains of the MOS transistors M21 and M22 of the adjacent latch unit 16 respectively. The respective drains of the MOS transistors M17 and M18 are connected to the output terminals 13 and 14, respectively. Further, respective sources of the MOS transistors M19 and M20 are commonly connected, and the common connecting point is connected to the drain common connecting point of the MOS transistors M5 to M8 of the aforementioned mixer circuit unit 100 at the lower stage shown in the drawing. A gate of the MOS transistor M19 is connected to a drain of the MOS transistor M20. A gate of the MOS transistor M20 is connected to a drain of the MOS transistor M19. The respective drains of the MOS transistors M19 and M20 are connected to the output terminals 13 and 14, respectively.

The second latch unit 16 as an I signal generating unit includes the MOS transistors M21 and M22 which form a differential pair, load resistances R3 and R4 for output, and the MOS transistors M23 and M24 which are cross-connected to each other between gates and drains.

In the second latch unit 16, respective sources of the MOS transistors M21 and M22 are commonly connected, and the source common connecting point is connected to the drain common connecting point of the MOS transistors M9 to M12 of the aforementioned mixer circuit unit 100 at the lower stage shown in the drawing. Drains of the MOS transistors M21 and M22 are connected to the power supply line of the positive voltage VDD respectively via load resistances R3 and R4. Respective gates of the MOS transistors M21 and M22 are connected to respective drains of the MOS transistors M18 and M17 of the adjacent latch unit 15 respectively. The respective drains of the MOS transistors M21 and M22 are connected to the output terminals 12 and 11, respectively. Further, respective sources of the MOS transistors M23 and M24 are commonly connected, and the source common connecting point is connected to the drain common connecting point of the MOS transistors M13 to M16 of the aforementioned mixer circuit unit 100 at the lower stage shown in the drawing. A gate of the MOS transistor M23 is connected to a drain of the MOS transistor M24. A gate of the MOS transistor M24 is connected to a drain of the MOS transistor M23. The respective drains of the MOS transistors M23 and M24 are connected to the output terminals 12 and 11, respectively.

Next, an operation of the present embodiment will be described with reference to FIG. 2 and FIG. 3.

In the semiconductor integrated circuit 300 of FIG. 2, the four transistors M31 to M34 in the clock input unit 50 of an ordinary ½-frequency divider circuit shown in FIG. 3 are each divided into four, and to each of the 16 MOS transistors M1 to M16 in total, two signals with different frequencies F1 and F2 are simultaneously inputted via the two capacitors (C1 and C2, C3 and C4, . . . , C31 and C32). This corresponds to inputting the signal obtained by addition of the two signals by capacitive coupling to each of the MOS transistors M1 to M16. Due to nonlinearity of the MOS transistor (in concrete, square characteristics of the drain current to the voltage between a gate and a source), a signal including the term of a product of the signal with the frequency F1 and the signal with the frequency F2 occurs to each of the drains of the MOS transistors M1 to M16.

As the input signals, the signals F1_I+, F1_I–, F1_Q+, F1_Q–, F2_I+, F2_I–, F2_Q+ and F2_Q– of four phases of I+, I–, Q+ and Q– shifted in phase by 90 degrees with respect to each of the frequencies F1 and F2 are used. As the result of multiplication in the mixer circuit unit 100, frequencies are added, and the sine wave of the frequencies F1+F2 is obtained, and is supplied to the ½-frequency divider unit 200. The ½-frequency divider unit 200 divides the frequencies of the signal with the frequencies F1+F2 into two to generate signals OUT_I+, OUT_I–, OUT_Q+ and OUT_Q– of four phases with a frequency (F1+F2)/2, and outputs them.

Here, in order to put the circuit of the first embodiment of FIG. 2 in contrast with the ½-frequency divider circuit of FIG. 3, FIG. 3 will be briefly described.

In the ordinary ½-frequency divider circuit shown in FIG. 3, when a clock (CK+) is inputted to a differential pair unit 39-1 of the latch unit 39 and a cross-coupled unit 40-2 of the latch unit 40 via the clock input unit 50, an inverted clock (CK–) is inputted to a remaining cross-coupled unit 39-2 of the latch unit 39 and a remaining differential pair unit 40-1 of the latch unit 40 via the clock input unit 50. The clock CK+ and the clock CK– are signals in the relation having the same frequency F and phases inverted from each other.

When it is assumed that $$(CK+)-(CK-)=\cos 2\pi Ft,$$

A differential of drain currents i+ and i– as the outputs of the MOS transistors M31 and M32 of the clock input unit 50 is expressed as below.

$$(i+)-(i-) \propto A \cos 2\pi Ft$$

Here, t represents a time, A represents a gain of the clock input unit 50, and F represents a frequency of the input signals CK+ and CK–. At this time, the outputs obtained by dividing the frequency into two by the ½-frequency divider unit 70 are the signals OUT_I+, OUT_I–, OUT_Q+ and OUT_Q– of four phases with a frequency F/2.

In contrast with this, in the first embodiment of the present invention shown in FIG. 2, to each of 100-1 and 100-4 of the mixer circuit unit 100, the I signal F1_I+ of a positive phase with the frequency F1 and the I signal F2_I+ of a positive phase with the frequency F2, the I signal F1_I– of a negative phase with the frequency F1 and the I signal F2_I– of a negative phase with the frequency F2, the Q signal F1_Q+ of a positive phase with the frequency F1 and the Q signal F2_Q+ of a positive phase with the frequency F2, and the Q signal F1_Q– of a negative phase with the frequency F1 and the Q signal F2_Q– of a negative phase with the frequency F2 are respectively inputted through the respective two capacitors which are two impedance elements. To each of 100-2 and 100-3 of the mixer circuit unit 100, the I signal F1_I+ of a positive phase with the frequency F1 and the I signal F2_I– of a negative phase with the frequency F2, the I signal F1_I– of a negative phase with the frequency F1 and the I signal F2_I+ of a positive phase with the frequency F2, the Q signal F1_Q+ of a positive phase with the frequency F1 and the Q signal F2_Q– of a negative phase with the frequency F2, and the Q signal F1_Q– of a negative phase with the frequency F1 and the Q signal F2_Q+ of a positive phase with the frequency F2 are respectively inputted via the respective two capacitors which are two impedances.

If the following expressions are assumed, $$F1\_I=(F1\_I+)-(F1\_I-)=\cos 2\pi F1t,$$

$$F1\_Q=(F1\_Q+)-(F1\_Q-)=-\sin 2\pi F1t$$

$$F2\_I=(F2\_I+)-(F2\_I-)=\cos 2\pi F2t,$$

$$F2\_Q=(F2\_Q+)-(F2\_Q-)=-\sin 2\pi F2t$$

The expression below is established.

$$(i+)-(i-) \propto (F1\_I \times F2\_I) - (F1\_Q \times F2\_Q) =$$
$$\cos 2\pi F1t \times \cos 2\pi F2t - \sin 2\pi F1t \times \sin 2\pi F2t = \cos 2\pi (F1+F2)t$$

If a gain A of the mixer circuit unit 100 is taken into consideration, the following expression is satisfied.

$$(i+)-(i-) \propto A \cos 2\pi(F1+F2)t$$

By the gain A of the mixer circuit unit 100, a signal level required for operating the ½-frequency divider unit 200 at the upper stage shown in the drawing can be secured.

Patent Document (Japanese Patent Application No. 2008-166992) describes the principle of performing multiplication with the circuit combining the capacitors and the transistors like the mixer circuit unit 100 of FIG. 2. As a result of multiplication of the mixer circuit unit 100, the frequencies are added, and the sine wave of the frequency F1+F2 is obtained, and is supplied to the ½-frequency divider unit 200. Accordingly, the signal with the frequency F1+F2 can be regarded as being inputted to the ordinary ½-frequency divider circuit (see FIG. 3). As a result, the signal outputted from the ½-frequency divider unit 200 has the frequency divided into two, and becomes the signals of four phases with the frequency (F1+F2)/2. As the SSB mixer, if the phase relation of the input signal is selected, the frequency of the output can be made |F1–F2|/2. The signal with the frequency |F1–F2|/2 means a subtraction signal as a desired main signal instead of the subtraction signal as an image signal that should to be removed, which will be described later.

Generally, when signals with the two frequencies F1 and F2 are inputted as inputs in the mixer, the operation of multiplication (mixing) is performed, but the frequencies are added and the signal of the frequency F1+F2 is outputted, in addition to which, subtraction is performed and the signal with the frequency F1–F2 is also outputted. Further, if the operation of multiplication is performed in the mixer by using the same phase component (I signal) and the quadrature component (Q signal), namely, by using the two signals shifted in phase by 90 degrees, it can be selected whether the added signal is intensely outputted or the subtracted signal is intensely outputted. When the I and Q signals of input which differ in phase and frequency are combined as in the case of FIG. 2, the added signal is intensely outputted, and the subtracted signal is weakly outputted. Here, the subtracted signal is set as an image signal which should be removed. More specifically, the mixer circuit unit 100 of FIG. 2 includes the image removing mixer function (the frequency converting function and the image removing function) and the amplifying function, and the image signal is made smaller (namely, removed), whereas the desired addition signal is amplified with a high gain by the transistors of the single gate mixer. The amplified signal immediately has the frequency divided by the ½-frequency divider unit 200 at the upper stage shown in the drawing directly connected to the mixer circuit unit 100. Thereby, even if the configuration is not adopted, in which an amplifier circuit and a BPF/BRF are separately provided as in the conventional circuit (FIG. 10), the amplifying function and the image removing mixer function are realized.

Further, the semiconductor integrated circuit in FIG. 2 has the configuration in which a mixer stage is incorporated in the ordinary ½-frequency divider circuit (FIG. 3). Therefore, a direct current (bias signal) flows in the sequence of, for example, the power supply line of VDD, to the differential pair unit 15-1 of the ½-frequency divider unit, to the source common connecting point of the MOS transistors M17 and M18 of the differential pair unit 15-1, to a common output channel (i+), to the drain common connecting point of the MOS transistors M1 to M4 of the mixer unit 100-1 of the mixer circuit unit, to the MOS transistors M1 to M4 of the mixer unit 100-1, to the source common connecting point of the MOS transistors M1 to M4, to the constant current source 9, to the stable potential point (ground), and the current used in the ½-frequency divider unit 200 can be commonly used in the mixer circuit unit 100. The image removing mixer function can be realized with a current similar to the ordinary ½-frequency divider circuit (FIG. 3). More specifically, direct currents are not used separately by separately disposing the image removing mixer circuit 54 and the ½-frequency divider circuit 58 as in the semiconductor integrated circuit of the conventional example of FIG. 10, and only a small amount of current is needed, whereby power is saved. Accordingly, without adoption of the configuration in which the amplifier circuits 55 and 57 and the BPF/BRF 56 are separately provided as in the conventional circuit (FIG. 10), the image signal is removed and the signal of the desired frequency can be amplified and outputted, in addition to which, the current amount is reduced, and the mounting area is reduced.

According to the first embodiment, the configuration is adopted, in which the input to the ½-frequency divider unit 200 is generated by the mixer circuit unit 100 using a single gate mixer, whereby the function of directly connecting the image removing mixer unit (including the amplifier unit) and the ½-frequency divider unit can be realized with one circuit. More specifically, the circuit in which when two signals with the different frequencies F1 and F2 are inputted, the frequency (F1+F2)/2 or (F1–F2)/2 is outputted can be realized without an amplifier circuit and a BPF/BRF, and reduction in the circuit area and power consumption is enabled.

Second Embodiment

Figure 4:
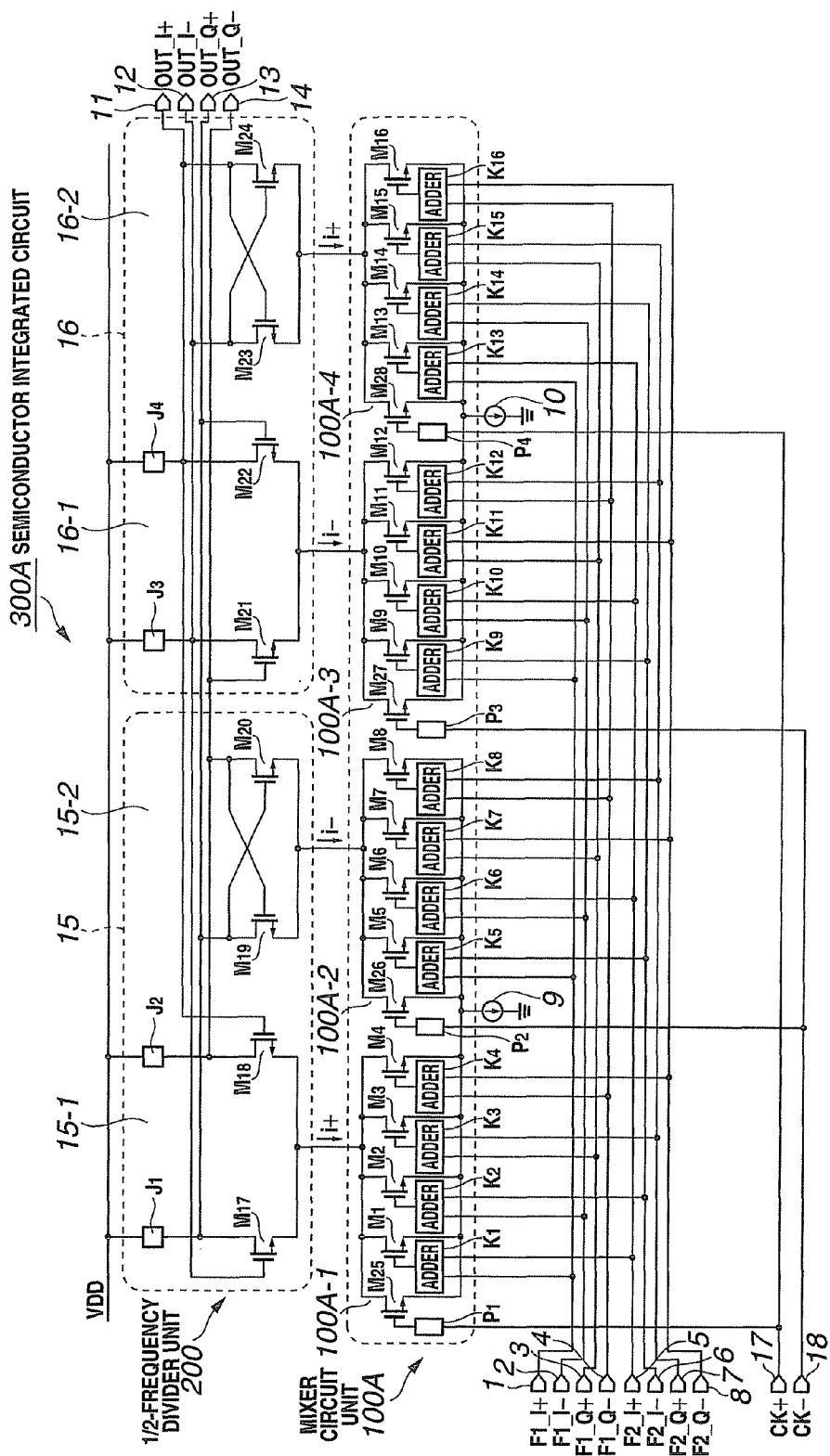
FIG. 4 is a circuit diagram showing a schematic configuration of a semiconductor integrated circuit of a second embodiment of the present invention.
Figure 5:
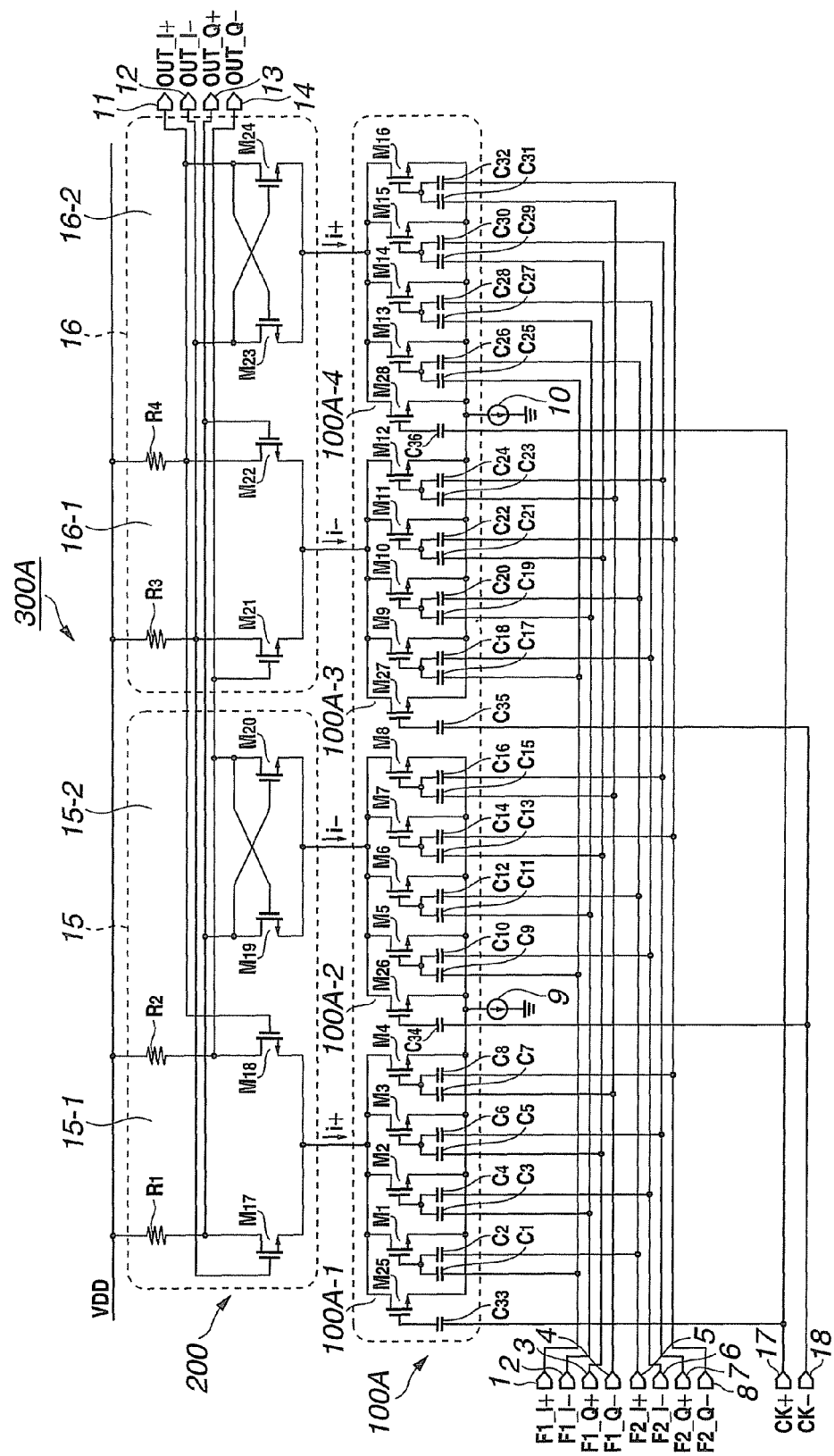
FIG. 5 is a circuit diagram showing the semiconductor integrated circuit of the second embodiment of the present invention.

FIG. 4 is a circuit diagram showing a schematic configuration of a semiconductor integrated circuit of a second embodiment of the present invention. FIG. 5 is a circuit diagram further embodying FIG. 4. The same portions as in FIG. 1 will be described by being assigned with the same reference numerals and characters.

A semiconductor integrated circuit 300A shown in FIG. 4 further includes a ninth input terminal 17 configured to receive a ninth voltage signal having a third frequency different from the first frequency and the second frequency, and a tenth input terminal 18 configured to receive a tenth voltage signal with a phase inverted from a phase of the ninth voltage signal, in addition to the semiconductor integrated circuit 300 of FIG. 1.

Further, the semiconductor integrated circuit 300A further includes a twenty-fifth transistor M25 in which a source is connected to the source common connecting point of the first to the fourth transistors M1 to M4, a drain is connected to the drain common connecting point of the first to the fourth transistors M1 to M4, and a ninth voltage signal is inputted to a gate via an impedance element P1, a twenty-sixth transistor M26 in which a source is connected to the source common connecting point of the fifth to the eighth transistors M5 to M8, a drain is connected to the drain common connecting point of the fifth to the eighth transistors M5 to M8, and a tenth voltage signal is inputted to a gate via an impedance element P2, a twenty-seventh transistor M27 in which a source is connected to the source common connecting point of the ninth to the twelfth transistors M9 to M12, a drain is connected to the drain common connecting point of the ninth to the twelfth transistors M9 to M12, and a tenth voltage signal is inputted to a gate via an impedance element P3, and a twenty-eighth transistor M28 in which a source is connected to the source common connecting point of the thirteenth to the sixteenth transistors M13 to M16, a drain is connected to the drain common connecting point of the thirteenth to the sixteenth transistors M13 to M16, and a ninth voltage signal is inputted to a gate via an impedance element P4, in addition to the semiconductor integrated circuit 300 of FIG. 1.

In the first embodiment of FIG. 1, the mixer circuit unit 100 as the mixer circuit unit including the first to the fourth mixer units 100-1 to 100-4 has eight kinds of I and Q voltage signals F1_I+, F1_I−, F1_Q+, F1_Q−, F2_I+, F2_I−, F2_Q+ and F2_Q− of four phases having two kinds of frequencies F1 and F2 respectively as input signals, and the first to the fourth mixer units 100-1 to 100-4 include four single gate mixers, respectively.

In contrast with this, in the second embodiment shown in FIG. 4, the input terminals 17 and 18 are newly added to the input terminals 1 to 8 of FIG. 1, so that voltage signals CK+ and CK− with the same frequency F of two phases with the phases in an inverse relation from each other (the relation different in phase by about 180 degrees) can be inputted to the input terminals 17 and 18. Further, a first to a fourth mixer units 100A-1 to 100A-4 forming a mixer circuit unit 100A as a mixer circuit unit respectively have configurations in which the MOS transistor M25 is added in parallel to the mixer unit 100-1, the MOS transistor M26 is added in parallel to the mixer unit 100-2, the MOS transistor M27 is added in parallel to the mixer unit 100-3 and the MOS transistor M28 is added in parallel to the mixer unit 100-4 of FIG. 1. The voltage signal CK+ inputted from the added input terminal 17 is inputted respectively to the gates of the MOS transistors M25 and M28 via the impedance elements P1 and P4, and the voltage signal CK− inputted from the added input terminal 18 is respectively inputted to the gates of the MOS transistors M26 and M27 via the impedance elements P2 and P3.

The first embodiment adopts the configuration in which each of the four transistors of the clock input unit of the ordinary ½-frequency divider circuit is divided into four, but the present second embodiment adopts the configuration in which each of the four transistors is divided into five instead of four, and four out of them are used as the single gate mixers as in the first embodiment, whereas the remaining one is used for input of the ordinary ½-frequency divider circuit. In FIG. 5, as the four impedance elements P1 to P4, capacitors C33 to C36 are used.

Thereby, in the circuit of the second embodiment, use of the eight input terminals 1 to 8 to which the eight I and Q signals F1_I+, F1_I−, F1_Q+, F1_Q−, F2_I+, F2_I−, F2_Q+ and F2_Q− with the frequencies F1 and F2 are inputted, or use of the two input terminals 17 and 18 to which the two signals CK+ and CK− with the frequency F are inputted can be selected and used in accordance with necessity. As a result, frequency conversion of (F1+F2)/2 is performed when the eight input terminals 1 to 8 are used, whereas frequency conversion of F/2 is performed when the two input terminals 17 and 18 are used. Accordingly, conversion into two kinds of frequencies can be realized with one circuit.

As the input signals, the signals F1_I+, F1_I−, F1_Q+, F1_Q−, F2_I+, F2_I−, F2_Q+ and F2_Q− of four phases I+, I−, Q+ and Q− each shifted in phase by 90 degrees with respect to the frequencies F1 and F2 can be generated by use of the frequency divider circuit and the phase shifter circuit not illustrated. As a result of multiplication of the mixer circuit unit 100, the frequencies are added and the sine wave with the frequency F1+F2 is obtained, and is supplied to the ½-frequency divider unit 200. The output signal from the ½-frequency divider unit 200 has the frequency divided into two and becomes signals OUT_I+, OUT_I−, OUT_Q+ and OUT_Q− of four phases with the frequency (F1+F2)/2. The signals CK+ and CK− of two phases with the frequency F become the signals OUT_I+, OUT_I−, OUT_Q+ and OUT_Q− of four phases which are output signals from the ½-frequency divider unit 200.

According to the second embodiment, by using the signals with the two different frequencies F1 and F2, or the signal with the frequency F which is different from the frequencies F1 and F2 as the input signals, acquisition of the signal with the frequency (F1+F2)/2 or the signal with the frequency F/2 is enabled, unlike the first embodiment. Accordingly, by performing division of frequency by properly using at least signals with the three different frequencies, the number of frequency signals which can be acquired can be increased.

Third Embodiment

Figure 6:
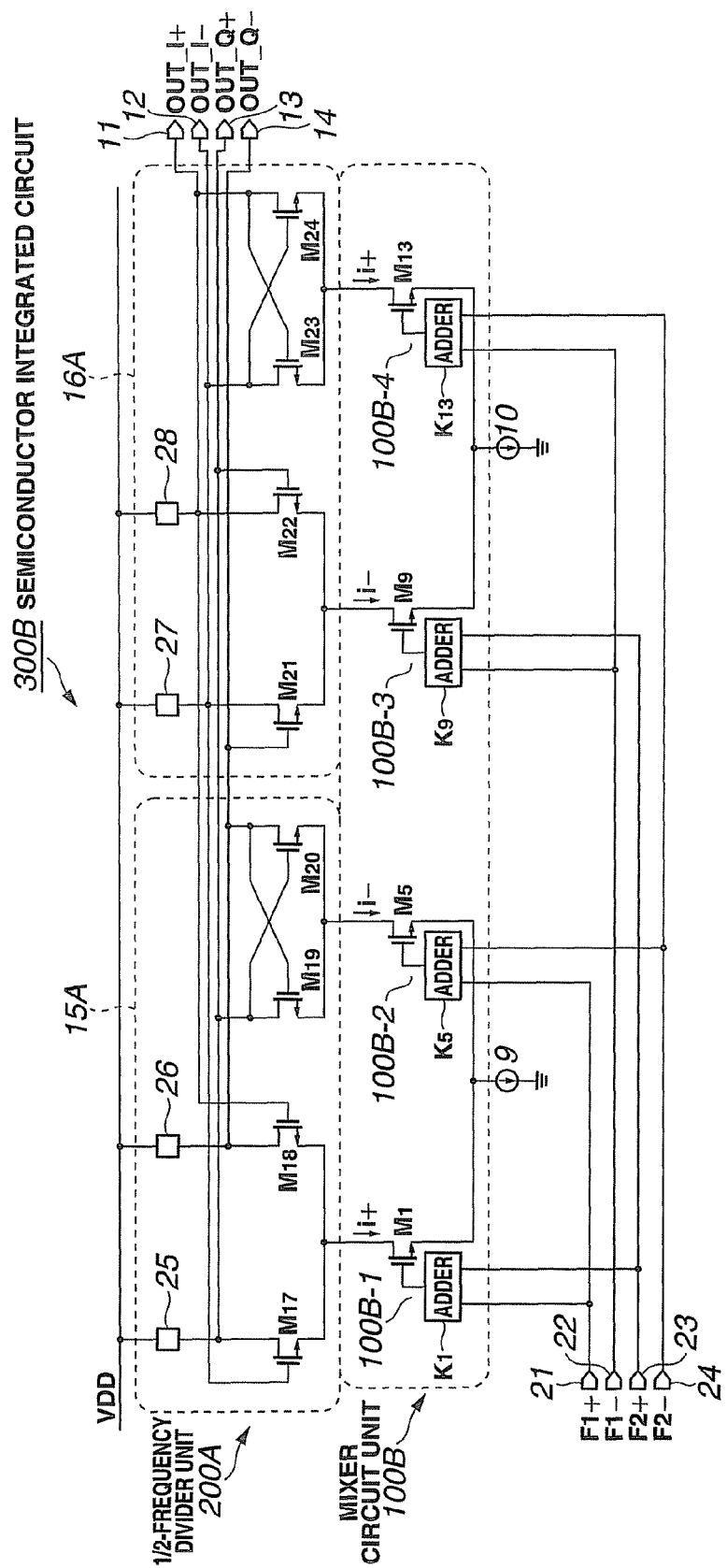
FIG. 6 is a circuit diagram showing a schematic configuration of a semiconductor integrated circuit of a third embodiment of the present invention.
Figure 7:
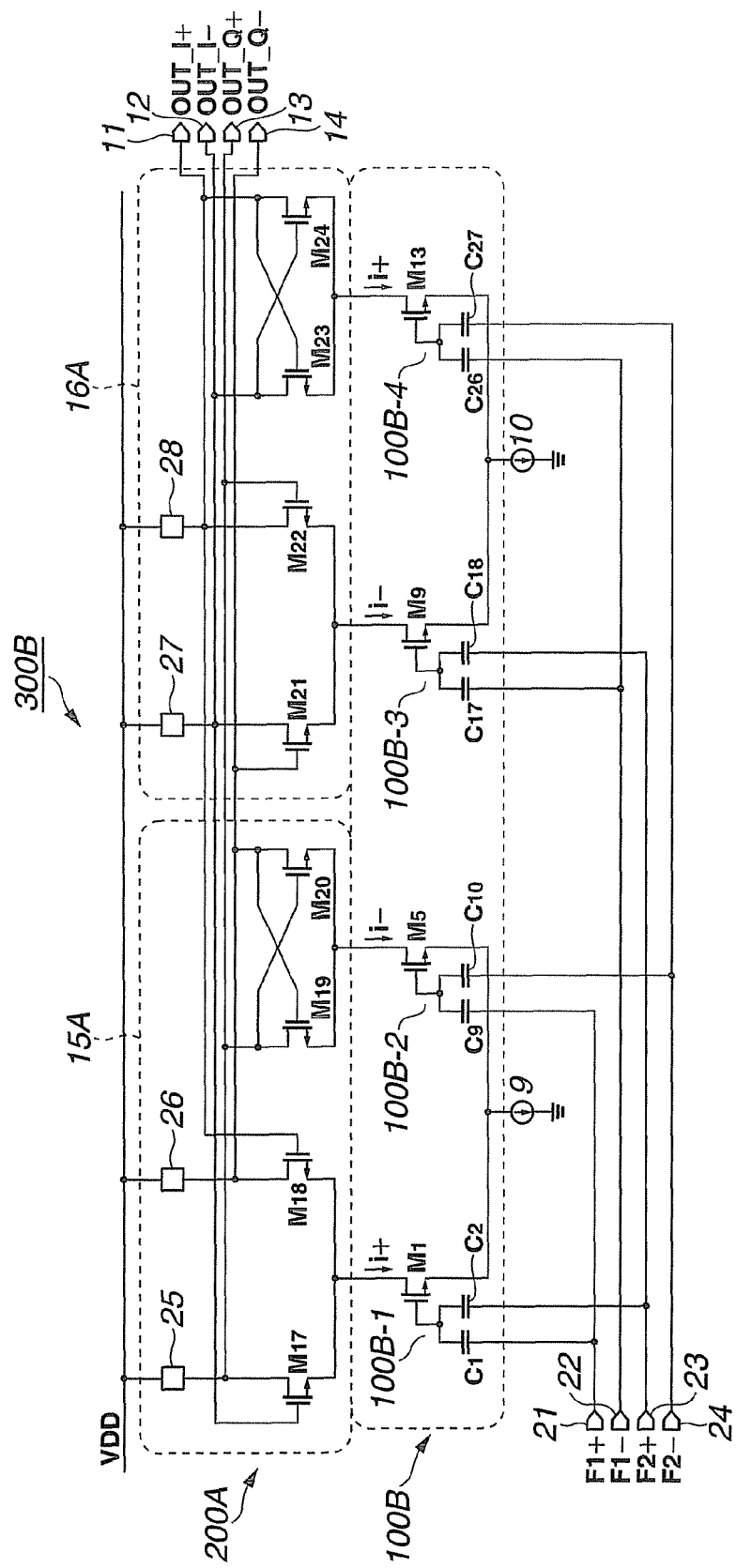
FIG. 7 is a circuit diagram showing the semiconductor integrated circuit of the third embodiment of the present invention.

FIG. 6 is a circuit diagram showing a schematic configuration of a semiconductor integrated circuit of a third embodiment of the present invention. FIG. 7 shows a circuit diagram further embodying FIG. 6. The same portions as in FIG. 1 will be described by being assigned with the same reference numerals and characters.

In FIG. 6, a semiconductor integrated circuit 300B includes a first input terminal 21 configured to receive a first voltage signal having a first frequency, a second input terminal 22 configured to receive a second voltage signal with a phase inverted from a phase of the first voltage signal, a third input terminal 23 configured to receive a third voltage signal having a second frequency different from the first frequency, and a fourth input terminal 24 configured to receive a fourth voltage signal with a phase inverted from a phase of the third voltage signal.

Further, the semiconductor integrated circuit 300B, as a mixer circuit unit 100B, includes the first transistor M1 in which the first voltage signal and the third voltage signal are inputted to a gate by being added or subtracted via the adder K1, the second transistor M5 in which the first voltage signal and the fourth voltage signal are inputted to a gate by being added or subtracted via the adder K5, the third transistor M9 in which the second voltage signal and the third voltage signal are inputted to a gate by being added or subtracted via the adder K9, and the fourth transistor M13 in which the second voltage signal and the fourth voltage signal are inputted to a gate by being added or subtracted via the adder K13.

Further, the semiconductor integrated circuit 300B includes the first constant current source 9 or the stable potential point to which the point commonly connecting the respective sources of the first transistor M1 and the second transistor M5 is connected, and the second constant current source 10 or the stable potential point to which the point commonly connecting respective sources of the third transistor M9 and the fourth transistor M13 is connected.

Further, the semiconductor integrated circuit 300B, as a ½-frequency divider unit 200A, includes the fifth and the sixth transistors M17 and M18 which form a differential pair, with a point commonly connecting respective sources being connected to the drain of the first transistor M1, a first frequency selective circuit 25 which is connected to between a drain of the fifth transistor M17 and a power supply line, a second frequency selective circuit 26 which is connected to between a drain of the sixth transistor M18 and the power supply line, the seventh and the eighth transistors M19 and M20 which forms a differential pair, with respective drains being connected to the respective drains of the fifth and the sixth transistors M17 and M18, and a point commonly connecting respective sources being connected to the drain of the second transistor M5, and have a latch function with the respective gates and the respective drains being cross-connected to one another, the ninth and the tenth transistors M21 and M22 which form a differential pair, with a point commonly connecting respective sources being connected to the drain of the third transistor M9 and respective gates being connected to the respective drains of the sixth and the fifth transistors M17 and M18, a third frequency selective circuit 27 which is connected to between a drain of the ninth transistor M21 and the power supply line, a fourth frequency selective circuit 28 which is connected to between a drain of the tenth transistor M22 and the power supply line, and the eleventh and the twelfth transistors M23 and M24 which form a differential pair, with respective drains being connected to the respective drains of the ninth and the tenth transistors M21 and M22, a point commonly connecting respective sources being connected to the drain of the fourth transistor M13, and the respective drains being connected to the respective gates of the fifth and the sixth transistors M17 and M18, and have a latch function with the respective gates and the respective drains being cross-connected to one another.

The first to the fourth frequency selective circuits 25 to 28 configure a frequency selective circuit unit.

Further, the semiconductor integrated circuit 300B includes the first output terminal 11 which is connected to a drain of the twelfth transistor M24 and is configured to output a first output signal of the same phase component with the frequency obtained by dividing the aforementioned first frequency, the aforementioned second frequency, a frequency obtained by addition of the aforementioned first and second frequencies, or a frequency obtained by subtraction of the aforementioned first and second frequencies into two, the second output terminal 12 which is connected to the drain of the eleventh transistor M23 and is configured to output a second output signal of a phase inverted from the phase of the first output signal, the third output terminal 13 which is connected to the drain of the seventh transistor M19 and is configured to output a third output signal with a phase orthogonalized to the phase of the first output signal, and the fourth output terminal 14 which is connected to the drain of the eighth transistor M20 and is configured to output the fourth output signal with a phase inverted from the phase of the third output signal.

In the third embodiment, three single gate mixers are omitted from each of the mixer units that are the first to the fourth mixer units in FIG. 1, and the first to the fourth mixer units 100B-1 to 100B-4 each including only one signal gate mixer are formed. The four input terminals 21 to 24 are included, which are configured to receive the voltage signals F1+ and F1−, of two phases and the voltage signals F2+ and F2− of two phases which have two different frequencies F1 and F2 with the phases in the inverted relation from one another (the relation differing in phase by about 180 degrees).

Further, the third embodiment includes the frequency selective circuits 25 to 28 having frequency selectiveness such as LC resonators and inductors instead of the load resistances R1 to R4 shown in FIG. 1.

In other words, the signals with the two different frequencies F1 and F2 are inputted to the clock input unit of the ordinary ½-frequency divider circuit shown in FIG. 3 via the two impedance elements. At this time, signals with the four frequencies F1/2, F2/2, (F1+F2)/2 and (F1−F2)/2 occur to the output channels of the respective drains of the MOS transistors M17, M18, M21 and M22, but by configuring the load circuit by the frequency selective circuits having the frequency selectiveness such as an LC resonator, only a desired component can be extracted from the four frequencies. When the third embodiment is compared with the first embodiment, the number of transistors for input and capacitors can be decreased, and the input capacity can be made small in return for cost increase to allow the load to have the frequency selectiveness. More specifically, input is made in two phases, and the load is allowed to have frequency selectiveness.

More concretely, in the circuit shown in FIG. 7, the four signals F1+, F1−, F2+ and F2− with the two different frequencies F1 and F2 of phases being inverted from each other (differing in phase from each other by about 180 degrees) with respect to each of the frequencies F1 and F2 are supplied to the input terminals 21 to 24.

The first mixer unit 100B-1 includes the two capacitors C1 and C2 configured to receive, add and output the two voltage signals F1+ and F2+ from the input terminals 21 and 23, and the MOS transistor M1 which has an added signal (F1+)+(F2+) inputted to the gate.

The second mixer unit 100B-2 includes the two capacitors C9 and C10 configured to receive, add and output the two voltage signals F1+ and F2− from the input terminals 21 and 24, and the MOS transistor M5 which has added signals (F1+)+(F2−) inputted to the gate.

The third mixer unit 100B-3 includes the two capacitors C17 and C18 configured to receive, add and output the two voltage signals F1− and F2+ from the input terminals 22 and 23, and the MOS transistor M9 which has added signals (F1−)+(F2+) inputted to the gate.

The fourth mixer unit 100B-4 includes the two capacitors C26 and C27 configured to receive, add and output the two voltage signals F1− and F1− from the input terminals 22 and 24, and the MOS transistor M13 which has added signals (F1−)+(F2−) inputted to the gate.

As the input signal, the two voltage signals F1− and F2− may be inputted from the input terminals 21 and 23, the two voltage signals F1− and F2+ may be inputted from the input terminals 21 and 24, the two voltage signals F1+ and F2− may be inputted from the input terminals 22 and 23, and the two voltage signals F1+F2+ may be inputted from the input terminals 22 and 24.

In this manner, as the input to the adder K1, F1+ and F2+, or F1− and F2− are respectively inputted to the input terminals 21 and 22. As the input to the adder K5, F1+ and F2−, or F1− and F2+ are respectively inputted to the input terminals 21 and 24. As the input to the adder K9, F1− and F2+ or F1+ and F2− are inputted to the input terminals 22 and 23. As the input to the adder K13, F1− and F2−, or F1+ and F2+ are respectively inputted to the input terminals 22 and 24. Two kinds of inputs to each of the adders K1, K5, K9 and K13 are independently selectable, and therefore, the combination of $2^4=16$ kinds of inputs in total is enabled.

The load resistances R1 to R4 are configured by the frequency selective circuits 25 to 28 having the frequency selectiveness such as LC resonators and inductors, whereby only a desired component of any one of four kinds of frequencies of F1/2, F2/2, (F1+F2)/2 and (F1−F2)/2 can be taken out to the output terminals 11 to 14 of the ½-frequency divider unit 200A.

Any one of use of all the four input terminals 21, 22, 23 and 24 to which the four signals F1_+, F1_−, F2_+ and F2_− with the frequencies F1 and F2 are inputted, use of only the two input terminals 21 and 22 to which the two signals F1_+ and F1_− with the frequency F1, or use of only the two input terminals 23 and 24 to which the two signals F2_+ and F2_− with the frequency F2 are inputted can be selected and used in accordance with necessity.

In the configuration of the third embodiment, the method of inputting the signal, which is different from the first embodiment, is adopted, and therefore, when all the four input terminals 21, 22, 23 and 24 are used, the signals with (F1+F2)/2 and the signal with (F1−F2)/2 are generated with about the same intensities as the output signals. However, with use of inductors having frequency selectivity and LC resonating circuit as loads, only the signal with the frequency of (F1+F2)/2 can be taken out, or only the signal with the frequency of (F1−F2)/2 can be taken out. Further, if only the signal with the frequency F1 is inputted without the signal with the frequency of F2 being inputted, the signal with the frequency of F1/2 can be taken out, and if only the signal with the frequency of F2 is inputted without the signal with the frequency of F1 being inputted, the signal with the frequency of F2/2 can be taken out.

According to the third embodiment, as compared with the first embodiment, the numbers of transistors for input and the capacitors are decreased, and the input capacity can be made small in return for cost increase to allow the load to have the frequency selectivity. Further, by performing frequency division by properly using the signals with two different frequencies, the number of signals with the frequencies which can be acquired can be increased.

Figure 8:
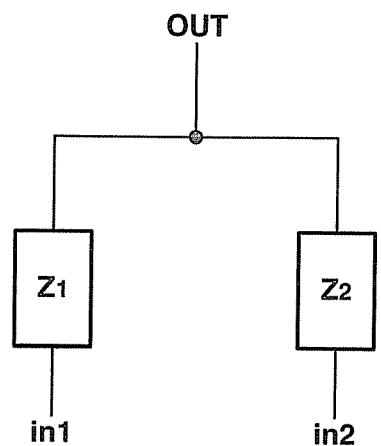
FIG. 8 is a block diagram showing a configuration of an adder in the present invention.
Figure 9:
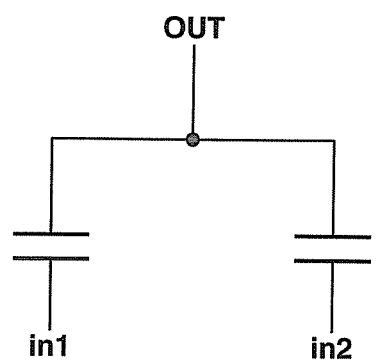
FIG. 9 is a circuit diagram showing a concrete configuration example of the adder of FIG. 8.

Next, with reference to FIG. 8 and FIG. 9, the configurations of the adders K1 to K16 which are used in the first to the third embodiments which are described above will be described. The adder in the present embodiment is configured so that two input signals in1 and in2 are taken out as an output signal out from a common output point (coupled point) through impedance elements Z1 and Z2 having substantially the same electric characteristics as shown in FIG. 8. As the impedance elements Z1 and Z2, two capacitors having the same capacitance as shown in FIG. 9, for example, can be used.

In the first to the third embodiments described above, the circuit configurations using N-channel MOS transistors as MOS transistors are described, but it goes without saying that the present invention can be applied to the circuit configurations using P-channel MOS transistors without being limited to this.

According to the present embodiments described above, a semiconductor integrated circuit which does not require an amplifier circuit, or BPF/BRF, and can reduce a circuit area and power consumption can be provided.

Having described the embodiments of the invention referring to the accompanying drawings, it should understood that the present invention is not limited to those precise embodiments and various changes and modifications thereof could be made by one skilled in the art without departing from the spirit or scope of the invention as defined in the appended claims.

What is claimed is:

1. A semiconductor integrated circuit, comprising:
   a mixer circuit unit configured to receive a first voltage signal having a first frequency, a second voltage signal of a phase inverted from a phase of the first voltage signal, a third voltage signal of a phase orthogonalized to the phase of the first voltage signal, and a fourth voltage signal of a phase inverted from the phase of the third voltage signal, and receive a fifth voltage signal having a second frequency, a sixth voltage signal of a phase inverted from a phase of the fifth voltage signal, a seventh voltage signal of a phase orthogonalized to the phase of the fifth voltage signal, and an eighth voltage signal of a phase inverted from the phase of the seventh voltage signal, and add the second frequency to or subtract the second frequency from the first frequency to make four current signals by performing mixing and voltage-current conversion using the first to eight voltage signals, to output the four current signals from a predetermined output channels; and
   a ½-frequency divider unit configured to carry out ½-frequency division by using the four current signals from the mixer circuit unit, and output a first to a fourth output signal of four phases obtained by dividing into two the four signals which are obtained by frequency addition or subtraction of the first frequency and the second frequency in the mixer circuit unit, the four phases of the first to fourth output signals comprising two phases orthogonalized to each other, and an other two phases obtained respectively by inverting the the orthogonalized phases,
   wherein the predetermined output channels of the mixer circuit unit are directly connected to input channels of the ½-frequency divider unit and a bias current flows on the predetermined output channel.

2. The semiconductor integrated circuit according to claim 1, wherein the mixer circuit unit includes:
   a first transistor with the first voltage signal and the fifth voltage signal being inputted to a gate by being added or subtracted via an adder;
   a second transistor with the second voltage signal and the sixth voltage signal being inputted to a gate by being added or subtracted via an adder;
   a third transistor with the third voltage signal and the seventh voltage signal being inputted to a gate by being added or subtracted via an adder;
   a fourth transistor with the fourth voltage signal and the eighth voltage signal being inputted to a gate by being added or subtracted via an adder;
   a fifth transistor with the first voltage signal and the sixth voltage signal being inputted to a gate by being added or subtracted via an adder;

a sixth transistor with the second voltage signal and the fifth voltage signal being inputted to a gate by being added or subtracted via an adder;

a seventh transistor with the third voltage signal and the eighth voltage signal being inputted to a gate by being added or subtracted via an adder;

an eighth transistor with the fourth voltage signal and the seventh voltage signal being inputted to a gate by being added or subtracted via an adder;

a ninth transistor with the first voltage signal and the sixth voltage signal being inputted to a gate by being added or subtracted via an adder;

a tenth transistor with the second voltage signal and the fifth voltage signal being inputted to a gate by being added or subtracted via an adder;

an eleventh transistor with the third voltage signal and the eighth voltage signal being inputted to a gate by being added or subtracted via an adder;

a twelfth transistor with the fourth voltage signal and the seventh voltage signal being inputted to a gate by being added or subtracted via an adder;

a thirteenth transistor with the first voltage signal and the fifth voltage signal being inputted to a gate by being added or subtracted via an adder;

a fourteenth transistor with the second voltage signal and the sixth voltage signal being inputted to a gate by being added or subtracted via an adder;

a fifteenth transistor with the third voltage signal and the seventh voltage signal being inputted to a gate by being added or subtracted via an adder; and a sixteenth transistor with the fourth voltage signal and the eighth voltage signal are inputted to a gate by being added or subtracted via an adder; and wherein the ½-frequency divider unit includes:

a seventeenth and an eighteenth transistor configured to form a differential pair, with a point commonly connecting respective sources being connected to a drain common connecting point of the first to the fourth transistors;

a first load circuit connected to between a drain of the seventeenth transistor and a power supply line, and configured to obtain a third output signal in the drain;

a second load circuit connected to between a drain of the eighteenth transistor and a power supply line, and configured to obtain a fourth output signal in the drain;

a nineteenth and a twentieth transistor configured to form a differential pair, with respective drains being connected to the respective drains of the seventeenth and the eighteenth transistors, and a point commonly connecting respective sources being connected to a drain common connecting point of the fifth to the eighth transistors, and configured to have a latch function with respective gates and the respective drains being cross-connected to one another between the transistors;

a twenty-first and a twenty-second transistor configured to form a differential pair, with a point commonly connecting respective sources being connected to a drain common connecting point of the ninth to the twelfth transistors, and respective gates being connected to the respective drains of the eighteenth and the seventeenth transistors;

a third load circuit connected to between a drain of the twenty-first transistor and a power supply line, and configured to obtain a second output signal in the drain;

a fourth load circuit connected to between a drain of the twenty-second transistor and a power supply line, and configured to obtain a first output signal in the drain; and a twenty-third and a twenty-fourth transistor configured to form a differential pair, with respective drains being connected to the respective drains of the twenty-first and the twenty-second transistors, a point commonly connecting respective sources is connected to a drain common connecting point of the thirteenth to the sixteenth transistors, and the respective drains being connected to respective gates of the seventeenth and the eighteenth transistors, and configured to have a latch function with respective gates and the respective drains being cross-connected to one another between the transistors.

3. The semiconductor integrated circuit according to claim 2, wherein the mixer circuit unit further includes:

a twenty-fifth transistor with a source being connected to a source common connecting point of the first to the fourth transistors, a drain being connected to the drain common connecting point of the first to the fourth transistors, and a ninth voltage signal having a third frequency differing from the first frequency and the second frequency being inputted to a gate via an impedance element;

a twenty-sixth transistor with a source connected to a source common connecting point of the fifth to the eighth transistors, a drain being connected to the drain common connecting point of the fifth to the eighth transistors, and a tenth voltage signal of a phase inverted from the phase of the ninth voltage signal being inputted to a gate via an impedance element;

a twenty-seventh transistor with a source being connected to a source common connecting point of the ninth to the twelfth transistors, a drain being connected to the drain common connecting point of the ninth to the twelfth transistors, and the tenth voltage signal being inputted to a gate via an impedance element; and a twenty-eighth transistor with a source being connected to a source common connecting point of the thirteenth to the sixteenth transistors, a drain being connected to the drain common connecting point of the thirteenth to the sixteenth transistors, and the ninth voltage signal being inputted to a gate via an impedance element.

4. The semiconductor integrated circuit according to claim 2, wherein in the adder, impedance elements are placed respectively on two signal lines to which two voltage signals are inputted, and output points of the two impedance elements are commonly connected.

5. The semiconductor integrated circuit according to claim 2, wherein the load circuit is a resistance.

6. The semiconductor integrated circuit according to claim 3, wherein the impedance element is a capacitor.

7. A semiconductor integrated circuit, comprising:

a mixer circuit unit configured to receive a first voltage signal having a first frequency and a second voltage signal of a phase inverted from a phase of the first voltage signal, and receive a third voltage signal having a second frequency and a fourth voltage signal of a phase inverted from the phase of the third voltage signal, and add the second frequency to or subtract the second frequency from the first frequency to make four current signals by performing mixing and voltage-current conversion using the first to fourth voltage signals, to output the four current signals from a predetermined output channels;

a ½-frequency divider unit configured to carry out ½-frequency division by using the four current signals from the mixer circuit unit, to obtain four output signals; and a frequency selective circuit unit provided at output channels of the ½-frequency divider unit and configured to output only a signal with a predetermined frequency selectively;

wherein the predetermined output channels of the mixer circuit unit are directly connected to input channels of the ½-frequency divider unit and a bias current flows on the predetermined output channels.

8. The semiconductor integrated circuit according to claim 7, wherein the frequency selective circuit unit is an LC resonator or an inductor.

9. A semiconductor integrated circuit, comprising:
a mixer circuit unit having a first single gate mixer configured to receive a first input signal having a first frequency and a second input signal having a second frequency as inputs, a second single gate mixer configured to receive the first input signal and a third input signal of a phase inverted from a phase of the second input signal as inputs, a third single gate mixer configured to receive a fourth input signal of a phase inverted from the phase of the first input signal and the second input signal as inputs, and a fourth single gate mixer configured to receive the third and the fourth input signals as inputs; and
a ½-frequency divider unit configured to receive four signals respectively outputted from the first to the fourth single gate mixers as inputs and obtain four output signals by dividing frequencies of the four signals into two
wherein predetermined output channels of the mixer circuit unit are directly connected to input channels of the ½-frequency divider unit.

10. The semiconductor integrated circuit according to claim 9, further comprising a frequency selective circuit unit provided in an output channel of the ½-frequency divider unit and configured to output only a signal with a predetermined frequency selectively.

11. The semiconductor integrated circuit according to claim 9, wherein the two input signals which are inputted to each of the first to the fourth single gate mixers are respectively inputted via adders.

12. The semiconductor integrated circuit according to claim 11, wherein the adder is configured by two impedance elements connected in parallel.

13. The semiconductor integrated circuit according to claim 12, wherein the two impedance elements are capacitors having same capacitance values.

14. The semiconductor integrated circuit according to claim 9, wherein the first to the fourth single gate mixers are configured by adders configured to add the two input signals and MOS transistors in which outputs from the adders are supplied to gates.

* * * * *